US007522145B2

United States Patent
Lee et al.

(10) Patent No.: US 7,522,145 B2
(45) Date of Patent: Apr. 21, 2009

(54) LIQUID CRYSTAL DISPLAY APPARATUS

(75) Inventors: Dong-Ho Lee, Seoul (KR); Jin Jeon, Anyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 239 days.

(21) Appl. No.: 10/183,129

(22) Filed: Jun. 26, 2002

(65) Prior Publication Data

US 2003/0043104 A1 Mar. 6, 2003

(30) Foreign Application Priority Data

Sep. 3, 2001 (KR) .............................. 2001-53920

(51) Int. Cl.
G09G 3/36 (2006.01)
(52) U.S. Cl. ........................................ 345/100; 345/94
(58) Field of Classification Search ................... 345/87, 345/90, 42, 93, 99, 100, 264; 349/31, 41–42, 349/46, 47, 48; 348/793
See application file for complete search history.

(56) References Cited

U.S. PATENT DOCUMENTS

| 4,789,857 | A | * | 12/1988 | Maurice | 345/93 |
| 4,822,142 | A | * | 4/1989 | Yasui | 349/48 |
| 4,908,710 | A | * | 3/1990 | Wakai et al. | 348/793 |
| 5,012,228 | A | * | 4/1991 | Masuda et al. | 345/88 |
| 5,365,284 | A | * | 11/1994 | Matsumoto et al. | 345/100 |
| 5,701,167 | A | * | 12/1997 | Yamazaki | 349/42 |
| 5,721,601 | A | * | 2/1998 | Yamaji et al. | 349/138 |
| 5,754,155 | A | * | 5/1998 | Kubota et al. | 345/98 |
| 5,838,400 | A | | 11/1998 | Ueda et al. | 349/58 |
| 5,850,216 | A | | 12/1998 | Kwon | 345/204 |
| 5,959,709 | A | * | 9/1999 | Asada et al. | 349/150 |

(Continued)

FOREIGN PATENT DOCUMENTS

JP 07-199154 8/1995

*Primary Examiner*—Sumati Lefkowitz
*Assistant Examiner*—Ke Xiao
(74) *Attorney, Agent, or Firm*—F. Chau & Associates, LLC.

(57) ABSTRACT

A liquid crystal display apparatus is disclosed. A plurality of pixel electrodes are arranged on a display region of a substrate in a matrix form having a plurality of column lines and a plurality of row lines. Each of a plurality of thin film transistors has a first current electrode connected to a corresponding one of the plurality of pixel electrodes. Each of a plurality of data lines is arranged between odd column line and even column line of a pair of the plurality of column lines and is connected to second current electrodes of thin film transistors which are coupled to odd column line and even column line of the pair. Each of a plurality of first gate lines is connected to gate electrodes of odd thin film transistors which are coupled to one of the plurality of row lines. Each of a plurality of second gate lines is connected to gate electrodes of even thin film transistors which is coupled to the one of the plurality of row lines. A data driving circuit is provided for driving the data lines. At least two gate driving circuits having a first gate driving circuit and a second gate driving circuit are provided, wherein the first gate driving circuit is connected to the plurality of first gate lines and the second gate driving circuit is connected to the plurality of second gate lines.

21 Claims, 15 Drawing Sheets

U.S. PATENT DOCUMENTS

| | | | |
|---|---|---|---|
| 6,075,505 A * | 6/2000 | Shiba et al. | 345/87 |
| 6,300,928 B1 * | 10/2001 | Kim | 345/92 |
| 6,380,919 B1 * | 4/2002 | Koyama et al. | 345/92 |
| 6,462,723 B1 * | 10/2002 | Yamazaki et al. | 345/82 |
| 6,545,653 B1 * | 4/2003 | Takahara et al. | 345/87 |
| 6,545,655 B1 * | 4/2003 | Fujikawa | 345/87 |
| 6,690,347 B2 * | 2/2004 | Jeon et al. | 345/100 |
| 2001/0015715 A1 | 8/2001 | Hebiguchi et al. | 345/92 |
| 2002/0024508 A1 * | 2/2002 | Nakamura et al. | 345/204 |

* cited by examiner

LIQUID CRYSTAL DISPLAY APPARATUS

BACKGROUND OF THE INVENTION

1. Field of the Invention

The present invention relates to a liquid crystal display apparatus, and more particularly, to a liquid crystal display apparatus having first and second gate driving circuits.

2. Description of the Related Art

A liquid crystal display (LCD) is one of the most popular flat panel displays (FPDs). An LCD generally includes two substrates, each having an electrode formed on an inner surface thereof, and a liquid crystal layer interposed between the two substrates. In an LCD, a voltage is applied to the electrode to re-align liquid crystal molecules and control an amount of light transmitted through the liquid crystal layer.

Generally, an LCD module has a gate driving circuit disposed at one side of a display region. FIG. 1 is a schematic view showing a conventional liquid crystal display module having a gate driving circuit. As shown in FIG. 1, the LCD module typically includes a display region 11, a data driving circuit 12, a gate driving circuit 14, a film cable 18, a printed circuit board 20. The data driving circuit 12 and the gate driving circuit 14 are formed adjacently to the display region 11 on a glass substrate 10 formed with a pixel array, and the printed circuit board 20 is connected with a terminal part by means of the film cable 18. As the gate driving circuit 14 is disposed at just one side of the display region 11, the LCD module may be asymmetric with respect to the center of the display region 11. An asymmetric LCD module inevitably induces a problem of enlarging the width of a display set since the display set is generally manufactured to be symmetric with respect to a center thereof. Thus, when the aforementioned LCD module is provided as a display device of portable equipment such as a notebook computer, a mobile phone, and a PDA, the LCD module serves as a significant factor of inhibiting the portable equipment from being light, thin, short, and small.

Thus, it is desirable to provide an LCD module for symmetrical arranging peripheral circuits with respect to the display region.

SUMMARY OF THE INVENTION

A liquid crystal display apparatus is provided, which includes: a plurality of pixel electrodes arranged on a display region of a substrate in a matrix form having a plurality of column lines and a plurality of row lines; a plurality of thin film transistors, each having a first current electrode connected to a corresponding one of the plurality of pixel electrodes; a plurality of data lines, each being arranged between odd column line and even column line of a pair of the plurality of column lines and being connected to second current electrodes of thin film transistors which are coupled to odd column line and even column line of the pair; a plurality of first gate lines, each being connected to gate electrodes of odd thin film transistors which are coupled to one of the plurality of row lines; a plurality of second gate lines, each being connected to gate electrodes of even thin film transistors which is coupled to the one of the plurality of row lines; a data driving circuit for driving the data lines; and at least two gate driving circuits having a first gate driving circuit and a second gate driving circuit, wherein the first gate driving circuit is connected to the plurality of first gate lines and the second gate driving circuit is connected to the plurality of second gate lines.

According to a preferred embodiment of the present invention, the first and second gate driving circuits drive the row lines of the pixel electrodes in a zigzag form. Each of the first and second gate driving circuits includes a plurality of stages and sequentially selects the plurality of gate lines in accordance with output signals of respective stages while the first gate driving circuit is supplied with a first clock signal and the second gate driving circuit is supplied with a second clock signal having a phase inverted with that of the first clock signal, and each of the stages includes; an input terminal connected with a previous gate line; an output terminal connected with a corresponding gate line; a control terminal connected with a next gate line; a clock terminal for receiving a corresponding clock signal; pull-up means connected between the clock terminal and output terminal for pulling up the corresponding gate line during a duty period of the clock signal during a turn-on state; pull-down means connected between the output terminal and a first power source voltage for allowing the corresponding gate line to pull down to the first power source voltage during the turn-on state; pull-up driving means connected to an input node of the pull-up means for turning on the pull-up means in response to a preceding edge of an input signal supplied to the input terminal and for turning off the pull-up means in response to a preceding edge of a control signal supplied to the control terminal; pull-down driving means connected to an input node of the pull-down means for turning off the pull-down means in response to a preceding edge of the input signal and for turning on the pull-down means in response to a preceding edge of the control signal; and floating blocking means connected between the input node of the pull-down means and a second power source voltage for constantly connecting the second power source voltage to the input node of the pull-down means to prevent the input node of the pull-down means from being floated.

According to a preferred embodiment of the present invention, each of the stages further includes turn-on blocking means connected between the input node of the pull-down means and the first power source voltage for connecting the first power source voltage to the input node of the pull-down means, thereby preventing turn-on of the pull-down means. The turn-on blocking means includes an NMOS transistor having a drain connected to the input node of the pull-down means, a gate connected to the output terminal and a source connected to the first power source voltage.

The pull-up driving means includes: a capacitor connected to the input node of the pull-up means and the output terminal; a first transistor having a drain and a gate commonly connected to the input terminal and a source connected to the input node of the pull-up means; a second transistor having a drain connected to the input node of the pull-up means, a gate connected to the input node of the pull-down means and a source connected to the first power source voltage; and a third transistor having a drain connected to the input node of the pull-up means, a gate connected to the control terminal, and a source connected to the first power source voltage.

The pull-down driving means includes: a fourth transistor having a drain coupled to the second power source voltage, a gate connected to the control terminal and a source coupled to the input node of the pull-down means; and a fifth transistor having a drain connected to the input node of the pull-down means, a gate coupled to the input terminal, and a source connected to the first power source voltage.

The floating blocking means includes a sixth transistor having a drain and a gate connected to the second power source voltage and a source connected to the input node of the pull-down means, in such a manner that the sixth transistor is formed to have a size smaller than that of the fifth transistor. A size ratio between the fifth transistor and sixth transistor is about 20:1.

According to a preferred embodiment of the present invention, the thin film transistors of the display region and thin film transistors of the gate driving circuit include an a-Si NMOS TFT. Each of the first and second gate driving circuits includes shift registers for sequentially selecting the plurality of gate lines in accordance with output signals of respective stages while the first gate driving circuit is supplied with a first clock signal and the second gate driving circuit is supplied with a second clock signal having a phase inverted with that of the first clock signal, and each of the stages includes: an input terminal connected with a previous gate line; an output terminal connected with a corresponding gate line; a control terminal connected with a next gate line; a clock terminal for receiving a corresponding clock signal; pull-up means for supplying the corresponding clock signal from either the first clock signal and the second clock signal to the output terminal; pull-down means for selectively pulling down the output terminal to the first power source; pull-up driving means, connected to an input node of the pull-up means, for charging a capacitor to turn on the pull-up means in response to the preceding edge of an input signal and for discharging the capacitor to turn off the pull-up means in response to a preceding edge of a driving signal of next gate line; and pull-down driving means, connected to the input node of the pull-down means, for turning off the pull-down means and for turning on the pull-down means in response to the preceding edge of the driving signal of next gate line.

The pull-up driving means includes: a capacitor connected to the input node of the pull-up means and the output terminal; a first transistor having a drain connected to a second power source voltage, a gate connected to the input signal and a source connected to the input node of the pull-up means; a second transistor having a drain connected to the input node of the pull-up means, a gate connected to the driving signal of next gate line and a source connected to the first power source voltage; and a third transistor having a drain connected to the input node of the pull-up means, a gate connected to the input node of the pull-down means and a source connected to the first power source voltage. The first transistor and third transistor have a ratio of approximately 2:1 in size.

The pull-down driving means includes: a fourth transistor having a drain and a gate commonly connected to the second power source voltage and a source connected to the input node of the pull-down means; and a fifth transistor having a drain coupled to the input node of the pull-down means, a gate connected to the input node of the pull-up means and a source connected to the first power source voltage. The fourth transistor and fifth transistor have a ratio of approximately 16:1 in size.

According to a preferred embodiment of the present invention, the first gate driving circuit is disposed in a first peripheral region of the display region for driving the plurality of first gate lines and the second gate driving circuit is disposed in a second peripheral region of the display region opposite to the first peripheral region with respect to the display region for driving the plurality of second gate lines. The first gate driving circuit is disposed at a first side of a peripheral region of the display region and the second gate driving circuit is disposed opposite to the peripheral region with respect to the, display region, for driving the plurality of first gate lines and the plurality of second gate lines, respectively. The data driving circuit is disposed in a first peripheral region and the first and second gate driving circuits are disposed in a second peripheral region.

A liquid crystal display apparatus is also provided, which includes: a display region comprising a plurality of pixel electrodes, a plurality of thin film transistors, a plurality of data lines, a plurality of first gate lines, and a plurality of second gate lines, wherein each thin film transistor has a first terminal connected to a corresponding gate line, a second terminal connected to a corresponding data line, and a third terminal connected a corresponding pixel electrode; a data driving circuit for driving the plurality of data lines; and at least two gate driving circuits having a first gate driving circuit and a second gate driving circuit, wherein the first gate driving circuit and the second gate driving circuit are activated in sequence to drive alternating rows of gate lines.

According to a preferred embodiment of the present invention, the first gate driving circuit is disposed to a first peripheral region of the display region for driving the plurality of first gate lines and the second gate driving circuit is disposed in a second peripheral region of the display region opposite to the first peripheral region with respect to the display region for driving the plurality of second gate lines. The first gate driving circuit is disposed at a first side of a peripheral region of the display region and the second gate driving circuit is disposed opposite to the peripheral region with respect to the display region, for driving the plurality of first gate lines and the plurality of second gate lines respectively. The data driving circuit is disposed in a first peripheral region and the first and second gate driving circuits are disposed in the first peripheral region.

BRIEF DESCRIPTION OF THE DRAWINGS

The above objects and other advantages of the present invention will become more apparent by describing in detail preferred embodiments thereof with reference to the attached drawings, in which.

DETAILED DESCRIPTION OF PREFERRED EMBODIMENTS

Hereinafter, the preferred embodiments of the present invention will be described in detail with reference to the accompanying drawings.

Figure 1:
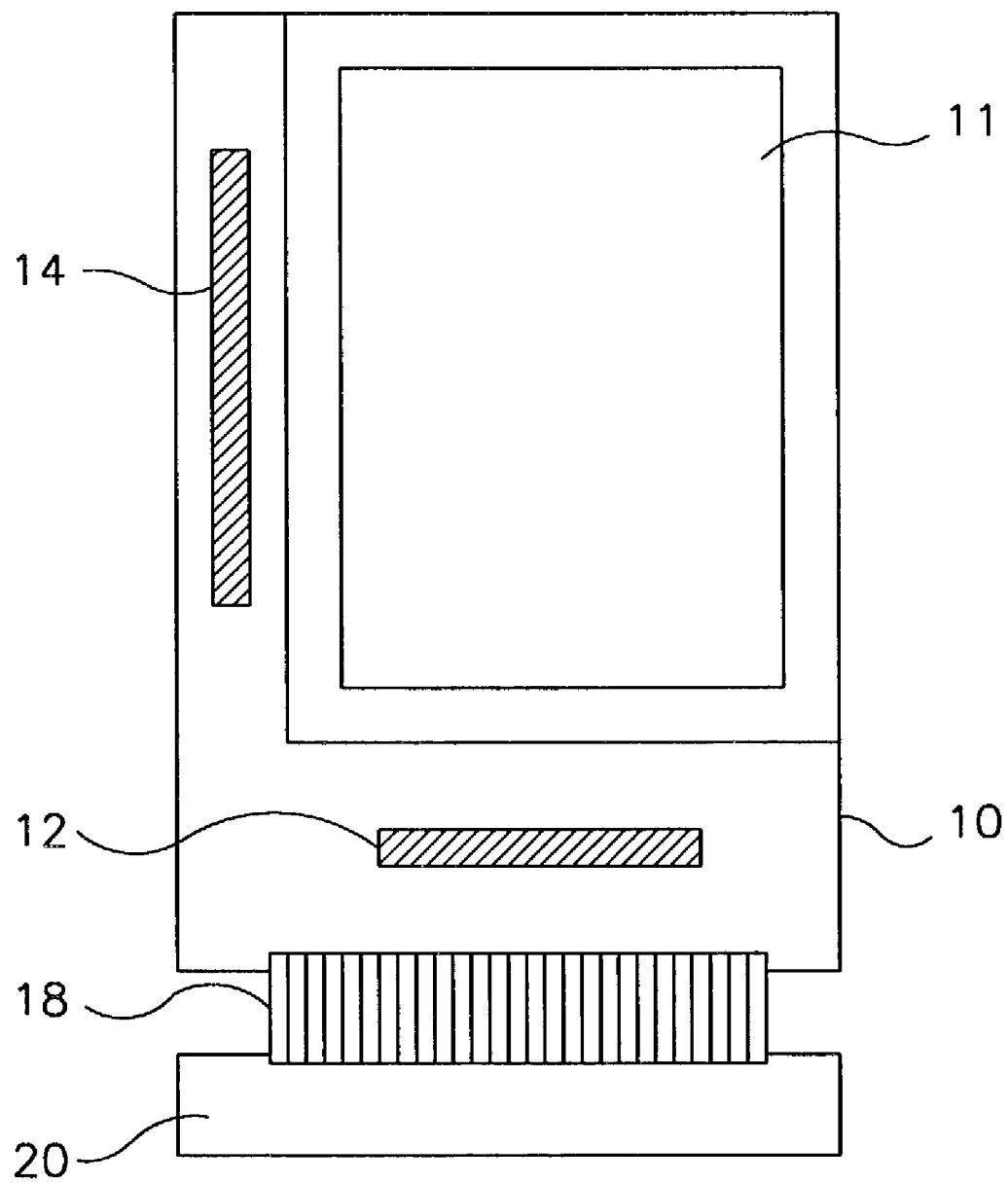
FIG. 1 is a schematic view showing a conventional asymmetric-type LCD module having a gate driving circuit.
Figure 2:
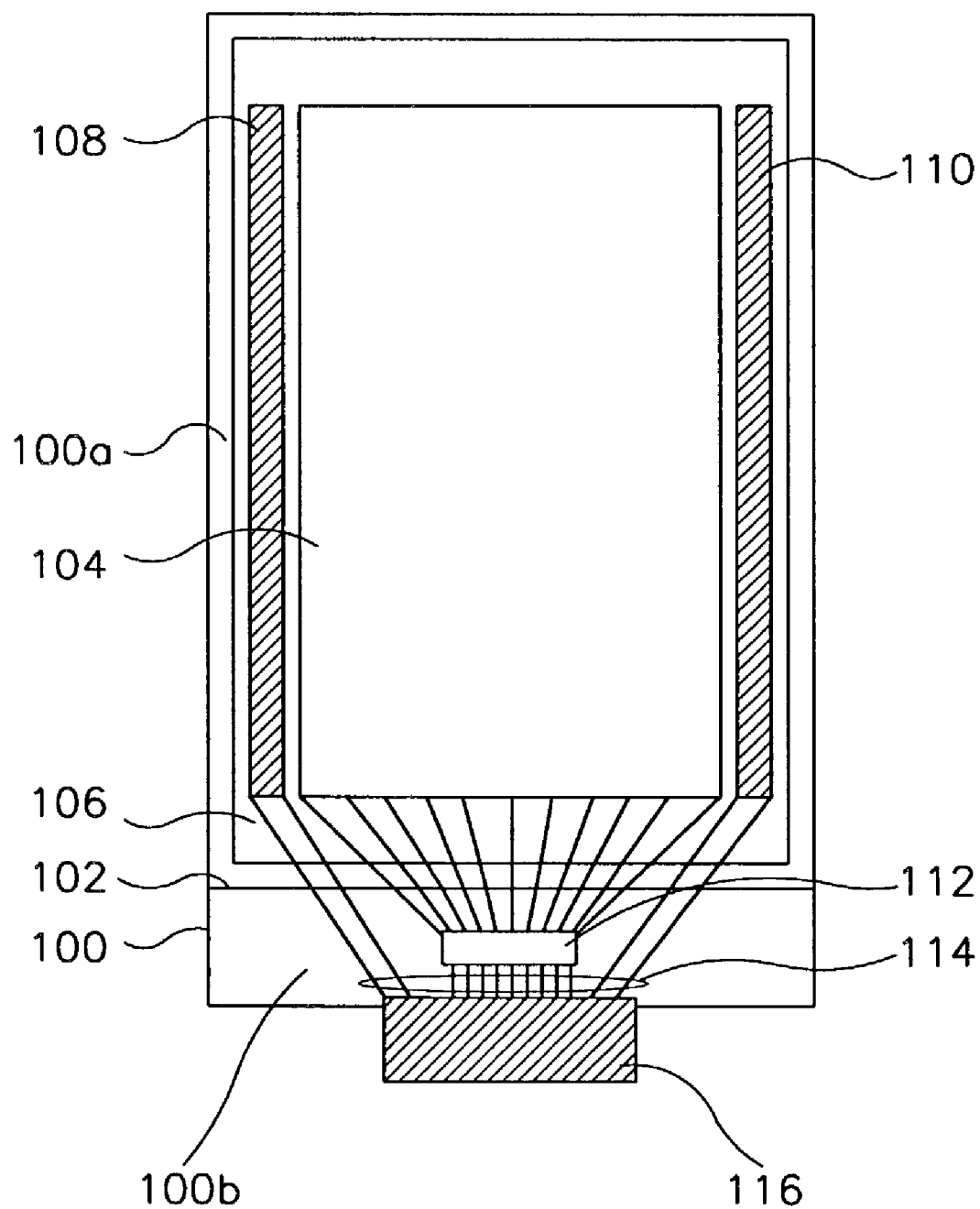
FIG. 2 is a schematic view showing a symmetric-type LCD module having dual gate driving circuits according to a preferred embodiment of the present invention.

FIG. 2 is a schematic view showing a symmetric-type liquid crystal display (LCD) module having dual gate driving circuits according to a preferred embodiment of the present invention.

Referring to FIG. 2, the LCD module includes a lower substrate 100 and an upper substrate 102. The lower substrate 100 is divided into a first region 100a overlapping with upper substrate 102 and a second region 100b without overlapping therewith.

The first region 100a includes a display region 104 and a peripheral region 106. After a liquid crystal is injected between the lower substrate 100 and the upper substrate 102, a marginal edge portion of the display region 104 and the peripheral region 106 are sealed with a sealing material. A first and a second gate driving circuits 108 and 110 are arranged onto the left and right portions of the peripheral region 106, respectively, symmetric with respect to the display region 104.

A data driving circuit 112 and an external connection terminal 114 are disposed in the second region 100b. One end of a film cable 116 is connected with the external connection terminal 114 and the other end of the film cable 116 is connected to an integrated printed circuit board (not shown). The data driving circuit 112 is fabricated in the form of a chip and mounted onto the lower substrate 100.

Figure 3:
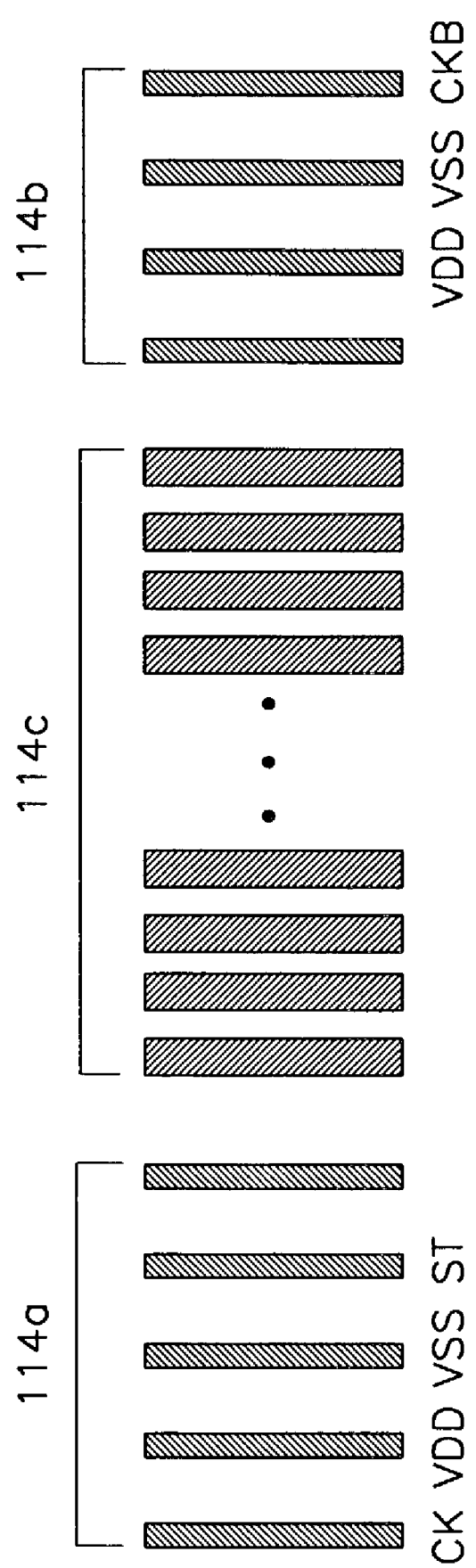
FIG. 3 is a layout showing an external connection terminal for connecting to a film cable of FIG. 2.

FIG. 3 is a layout showing an external connection terminal 114 for connecting to the film cable of FIG. 2 As shown in FIG. 3, the external connection terminal 114 has a first terminal group 114a, a second terminal group 114b, and a channel terminal group 114c disposed between the first terminal group 114a and the second terminal group 114b. The first terminal group 114a connected to the first gate driving circuit 108 (in FIG. 2) includes a start signal input terminal ST, a first clock signal input terminal CK, a first power source voltage terminal VOFF or VSS, and a second power source voltage terminal VON or VDD. Also, the second terminal group 114b connected to the second gate driving circuit 110 (in FIG. 2) includes a second clock signal input terminal CKB having a phase inverted with the first clock signal input terminal CK, a first power source voltage terminal VOFF or VSS, and a second power source voltage terminal VON or VDD. The channel terminal group 114c is connected to the data driving circuit 112 (in FIG. 2).

Figure 4:
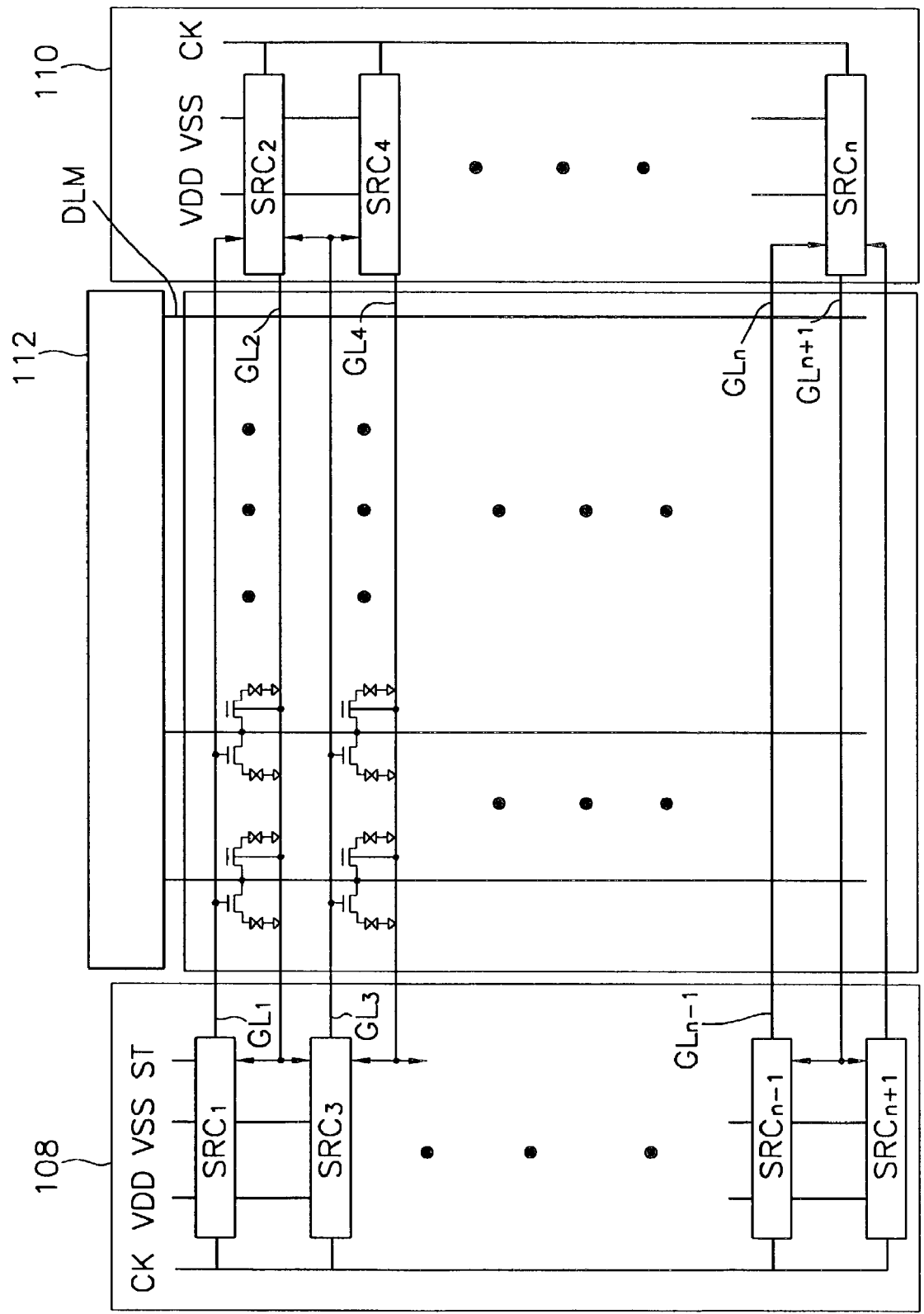
FIG. 4 is a block diagram showing the LCD module of FIG. 2.

FIG. 4 is a block diagram showing the LCD module of FIG. 2.

Referring to FIG. 4, the first gate driving circuit 108 includes a plurality of shift registers $SRC_1$, $SRC_3$, ..., $SRC_{n-1}$, and $SRC_{n+1}$ (hereinafter "$SRC_i$") respectively connected with output terminals and is placed at one side of peripheral area of the display region 104 having oddth gate lines $GL_1$, $GL_3$, ..., $GL_{n-1}$, and $GL_{n+1}$ (hereinafter "$GL_i$") extending thereto. The second gate driving circuit 110 includes a plurality of shift registers $SRC_2$, $SRC_4$, ..., $SRC_{n-2}$, and $SRC_n$ (hereinafter "$SRC_j$") respectively connected to output terminals and is placed at the other side of peripheral area of the display region 104 having eventh gate lines $GL_2$, $GL_4$, ..., $GL_{n-2}$, and $GL_n$ (hereinafter "$GL_j$") extending thereto.

An output signal of an oddth shift register $SRC_i$ is supplied as a start signal to an input terminal of the next eventh shift register $SRC_j$ disposed symmetrically to the oddth shift register $SRC_i$ with respect to the display region 104. Simultaneously, the output signal of the oddth shift register $SRC_i$ is provided as a control signal to a control terminal of the previous eventh shift register $SRC_{j-2}$. Similarly, an output signal of an eventh shift register $SRC_j$ is supplied as a start signal to an input terminal of the next oddth shift register $SRC_{i+2}$ while being supplied to the control terminal of the previous oddth shift register $SRC_i$ as a control signal. The last oddth shift register $SRC_{n+1}$ is added as a dummy register for supplying the control signal to a control terminal of the last eventh shift register $SRC_n$. The display region 104 includes a plurality of pixel electrodes having oddth pixel electrodes and eventh pixel electrodes, a plurality of thin film transistors, a plurality data lines, and a plurality of gate lines, which are not shown in detail in FIG. 4.

Figure 5:
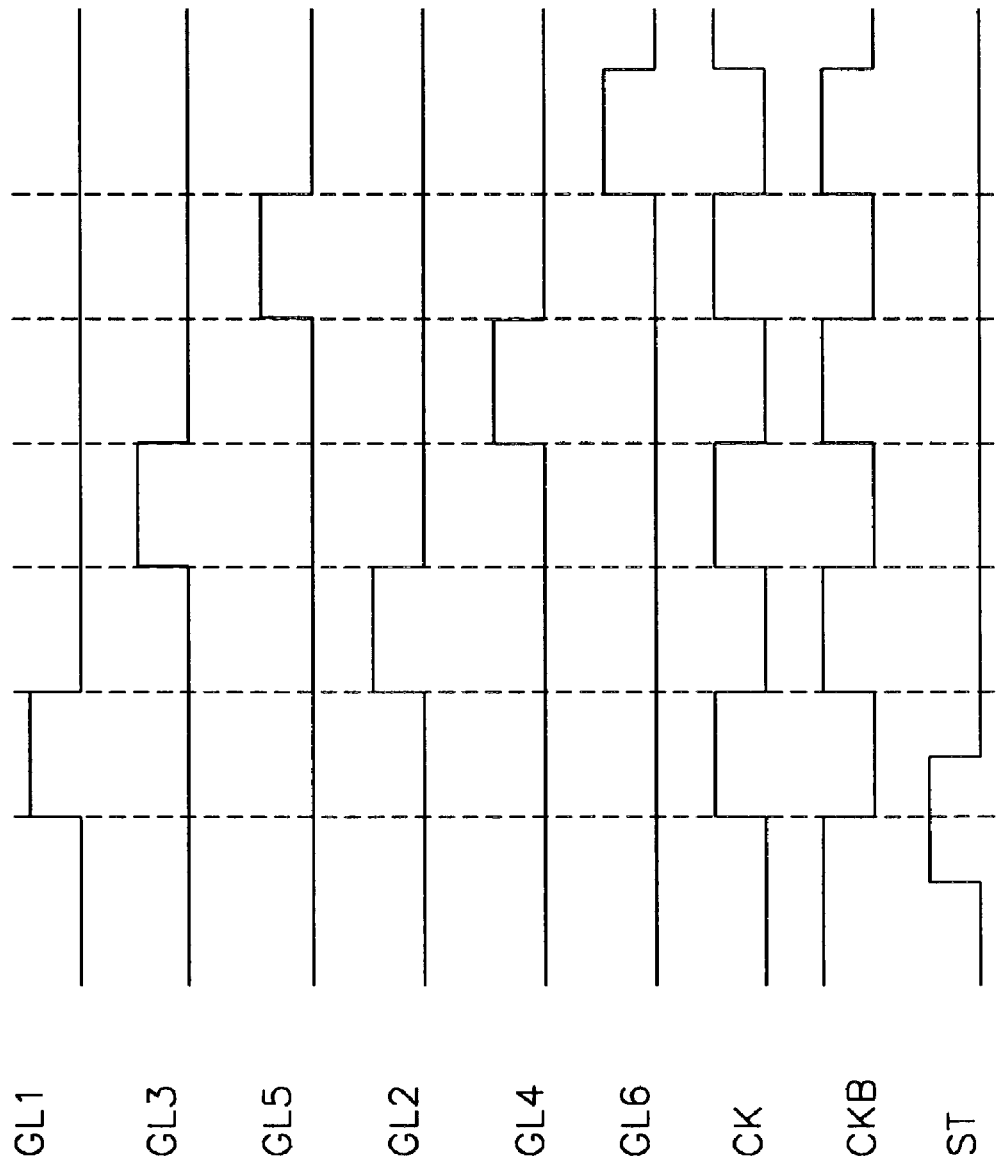
FIG. 5 is a timing diagram of signals from the circuit of the LCD module of FIG. 4.

FIG. 5 shows a timing diagram of signals from the circuit of the LCD module of FIG. 4.

Referring to FIG. 5, the oddth gate lines $GL_i$ and eventh gate lines $GL_j$ are alternately scanned clock signals CK and CKB, respectively, while being sequentially shifted by the start signal ST.

According to a preferred embodiment of the present invention, the pixel electrodes are arranged on the display region 104 in rows and columns in a matrix form. The oddth pixel electrodes are driven by a corresponding oddth gate line $GL_1$, and the eventh pixel electrodes are driven by a corresponding eventh gate line $GL_2$. The two gate lines $GL_1$ and $GL_2$ are driven to display all pixels connected to the horizontal low line. Consequently, the number of gate lines is increased twofold, for example, 320 gate lines are required when the vertical resolution is 160 horizontal lines.

The plurality of thin film transistors correspond to the plurality of pixel electrodes in the display region 104, and each thin film transistor has a first current electrode connected to a corresponding pixel electrode.

According to a preferred embodiment of the present invention, the plurality of data lines are respectively arranged between oddth column lines and even column lines of the plurality of the pixel electrodes. And each data line is commonly connected to a corresponding second current electrode of the thin film transistor.

In accordance with the above gate driving system, two thin film transistors adjacent in the horizontal direction commonly share a single data line, and two thin film transistors are connected to the gate lines separated from each other. As a result, even though the pixel electrodes are provided in the same horizontal line, the oddth pixel electrodes are first charged by the first gate driving circuit, and the eventh pixel electrodes are then charged by the second gate driving circuit after being delayed as long as one clock.

Accordingly, when the number of color pixel electrodes of one horizontal line is 240, the data driving circuit requires 720 data lines in total connected to respective RGB pixel electrodes. Therefore, in such configuration, two data driving chips each having 360 data output terminals should be employed for driving 720 data lines.

However, according to an embodiment of the present invention, since the oddth 360 unit pixel electrodes can be first charged in accordance with the above-described dual gate driving system and the eventh 360 unit pixel electrodes can be charged after delaying by one clock, the number of data driving lines needed is 360. Thus, the required number of data driving lines can be reduced to half as compared to the above configuration. For this reason, only one data driving chip having 360 data output terminals is needed. Additionally, the line pattern of the peripheral region for connecting the data driving chip and data lines can be easily implemented.

Figure 6:
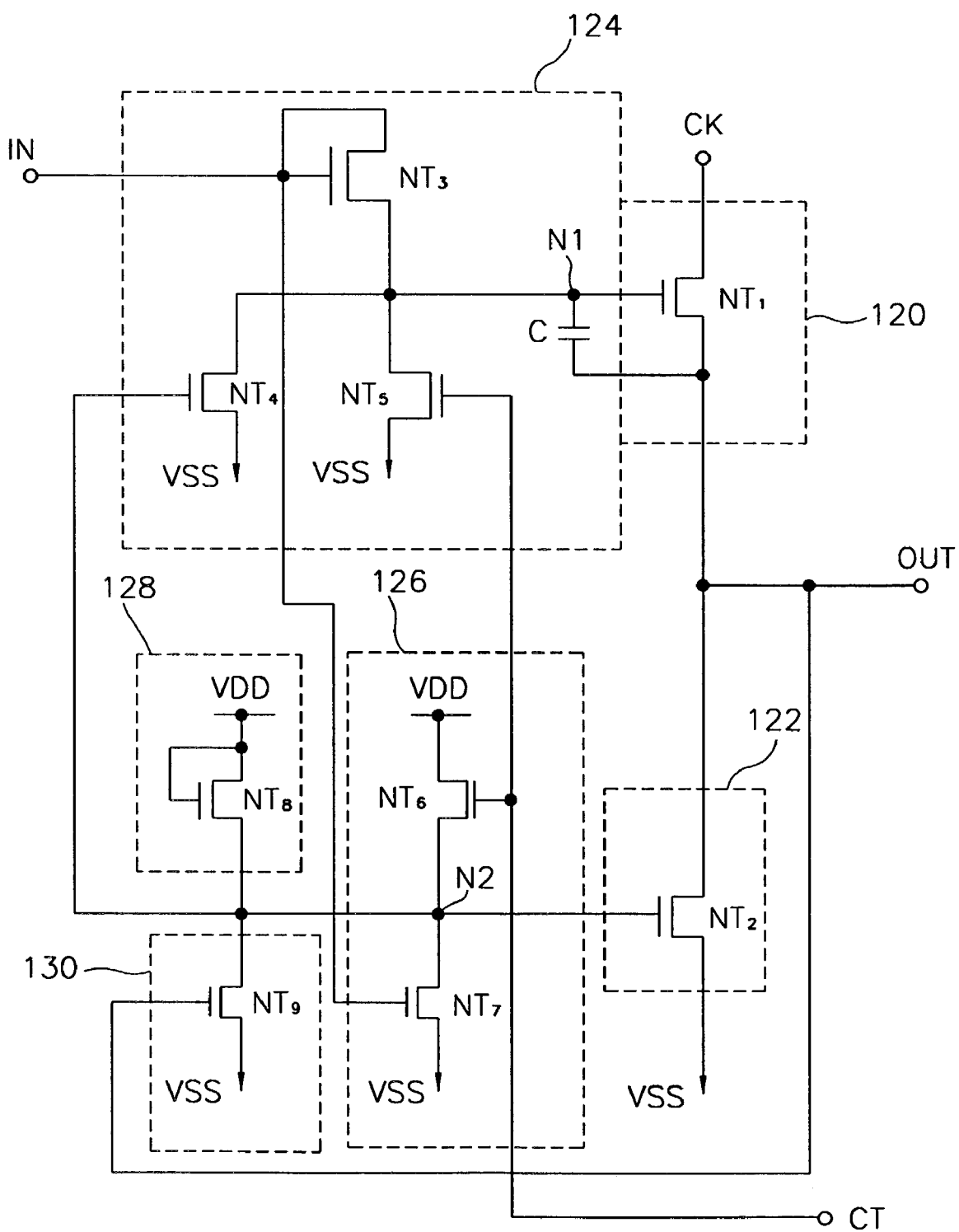
FIG. 6 is a circuit diagram showing respective stages of the gate driving circuit shown in FIG. 4 according to a preferred embodiment of the present invention.

FIG. 6 is a circuit diagram showing respective stages of the gate driving circuit shown in FIG. 4.

Respective stages of FIG. 4 includes a pull-up unit 120, a pull-down unit 122, a pull-up driving unit 124, a pull-down driving unit 126, a floating blocking unit 128, and a turn-on blocking unit 130.

The pull-up unit 120 includes a pull-up NMOS transistor $NT_1$ having a drain connected to the first clock signal input terminal CK, a gate connected to a first node N1, and a source connected to an output terminal OUT.

The pull-down unit 122 includes a pull-down NMOS transistor $NT_2$ having a drain connected to the output terminal OUT, a gate connected to a second node N2, and a source connected to the first power source voltage terminal VSS.

The pull-up driving unit 124 includes a capacitor C and NMOS transistors $NT_3$, $NT_4$, and $NT_5$. The capacitor C is connected to the first node N1 and the output terminal OUT. The transistor $NT_3$ has a drain and a gate commonly connected to the input terminal IN and a source connected to the first node N1. The transistor $NT_4$ has a drain connected to the first node N1, a gate connected to the second node N2 and a source connected to the first power source voltage terminal VSS. The transistor $NT_5$ has a drain connected to the first node N1, a gate connected to a control terminal CT, and a source connected to the first power source voltage terminal VSS.

The pull-down driving unit 126 includes two NMOS transistors $NT_6$ and $NT_7$. The transistor $NT_6$ has a drain connected to the second power source voltage terminal VDD, a gate connected to the control terminal CT, and a source connected to the second node N2. The transistor $NT_7$ has a drain connected to the second node $N_2$, a gate connected to the input terminal IN, and a source connected to the first power source voltage terminal VSS.

The floating blocking unit 128 includes an NMOS transistor $NT_8$ having a drain and a gate commonly connected to the second power source voltage terminal VDD and a source connected to the second node N2. The transistor $NT_8$ has a smaller size than that of the transistor $NT_7$ in the ratio of, e.g., about 1:20.

The turn-on blocking unit 130 includes an NMOS transistor $NT_9$ having a drain connected to the second node $N_2$, a gate connected to the output terminal OUT, and a source connected to the first power source voltage terminal VSS. The transistor $NT_9$ and the transistor $NT_7$ have a relation in the ratio of about 1:2 in size.

Referring back to FIGS. 4 and 5, once the first clock signal CK and a scan start signal ST are supplied to the shift register SRC of the gate driving circuit 108, the first register $SRC_1$ delays a high level interval of the first clock signal CK in response to the preceding edge of the scan start signal ST and output the signal to the gate line $GL_1$ connected to the output terminal.

An active interval of the scan start signal ST has a phase ahead of the high level interval of the first clock signal CK by as long as about ¼ period. The active interval of the scan start signal ST is divided into a setup time from the preceding edge of the pulse, i.e., from the rising edge, and a hold time to the succeeding edge of the pulse, i.e., falling edge. Accordingly, a preceding edge of output signal of the output terminal OUT has the preceding edge delayed by as long as a predetermined time of about 2-4 microseconds from the starting point of the hold time, i.e., rising edge. In other words, the active interval, i.e., high level interval, of the first clock signal CK is delayed by as long as a predetermined time to be presented to the output terminal. This is because the capacitor C of the pull-up driving unit 124 begins to be charged via the transistor $NT_3$ at the preceding edge of the start signal ST under the state that the transistor $NT_4$ is turned off, the pull-up transistor $NT_1$ is turned on when the voltage of the capacitor C becomes higher than the threshold voltage between the gate and source of the pull-up transistor $NT_1$, and the high level interval of the first clock signal CK begins to appear at the output terminal.

Once the high level interval of the clock signal appears on the output terminal OUT, the output voltage is bootstrapped to the capacitor C to raise the gate voltage of the pull-up transistor $NT_1$ to be higher than the turn-on voltage VDD. Therefore, the pull-up transistor $NT_1$ remains in the full conduction state.

In the meantime, in connection with the pull-down driving unit 126, since the transistor $NT_7$ is turned-on at the preceding edge of the scan start signal ST and the transistor $NT_6$ is turned-off, the potential of the second node N2 is pulled-down to the first power source voltage VSS. At such time, the transistor $NT_8$ of the floating blocking unit 128 remains at the turn-on state. Because the size of the transistor $NT_7$ is larger than that of the transistor $NT_8$ by about 20 times or so, the second node N2 is pulled-down to the first power source voltage VSS, thereby turning-off the pull-down transistor $NT_2$.

When the turn-on voltage VON (i.e., VDD) is generated on the output terminal OUT, the transistor $NT_9$ of the turn-on blocking unit 130 is turned on to increase the capacity of driving the second node N2 by means of the first power source voltage VSS by as much as about 50%. As a result, the voltage of the second node N2 cannot be raised due to parasitic capacitance between the drain and source of the pull-down transistor during the rising transition of the output signal. Hence, false turn-on or off of the pull-down transistor during the rising transition of the output signal is prevented. The output signal of the output terminal OUT is delayed as long as the duty period of the first clock signal CK prior to being output.

Once a voltage of the output signal of the output terminal OUT is dropped down to the turn-off voltage VOFF (i.e., VSS), the transistor $NT_9$ is turned off. By doing so, the second node N2 is in a state of being supplied with just the second power source voltage VDD via the transistor $NT_8$, so that the potential of the second node N2 is pulled-up from the first power source voltage VSS to the second power source voltage VDD. When the potential of the second node N2 rises to higher than the threshold voltage of the transistor $NT_4$, the transistor $NT_4$ is turned on and acts to discharge the charging voltage of the capacitor, thereby turning-off the pull-up transistor $NT_1$.

Successively, an output signal of the next stage supplied to the control terminal CT is raised to a turn-on voltage, thereby turning on the transistors $NT_5$ and $NT_6$. By doing so, the potential of the second node N2 is rapidly raised by the second power source voltage VDD supplied by the transistors $NT_6$ and $NT_8$, and the potential of the first node $N_1$ rapidly falls to the first power source voltage VSS via the transistors $NT_4$ and $NT_5$. Thus, the pull-up transistor $NT_1$ is turned off and the pull-down transistor $NT_2$ is turned on, pulling down the output terminal OUT to the turn-off voltage VOFF.

Even if the output signal of the next stage supplied to the control terminal CT is at a low level and the transistor $NT_6$ is turned-off, the second node N2 remains at VDD due to the transistor $NT_8$ being on, and the first node $N_1$ remains at VSS due to the transistor $NT_4$ being at the turn-on state. Therefore, because the potential of the second node $N_2$ remains at the second power source voltage VDD even if the threshold voltage of the transistors $NT_2$ and $NT_4$ begin to rise due to extended usage. Thus, the circuit is prevented from falsely turning off the pull-down transistor $NT_2$.

Thus, respective stages $SRC_1$ to $SRC_4$ are operated in the zigzag form, e.g., from oddth to eventh and back to oddth registers to sequentially operate the gate lines as described above in detail.

Figure 7:
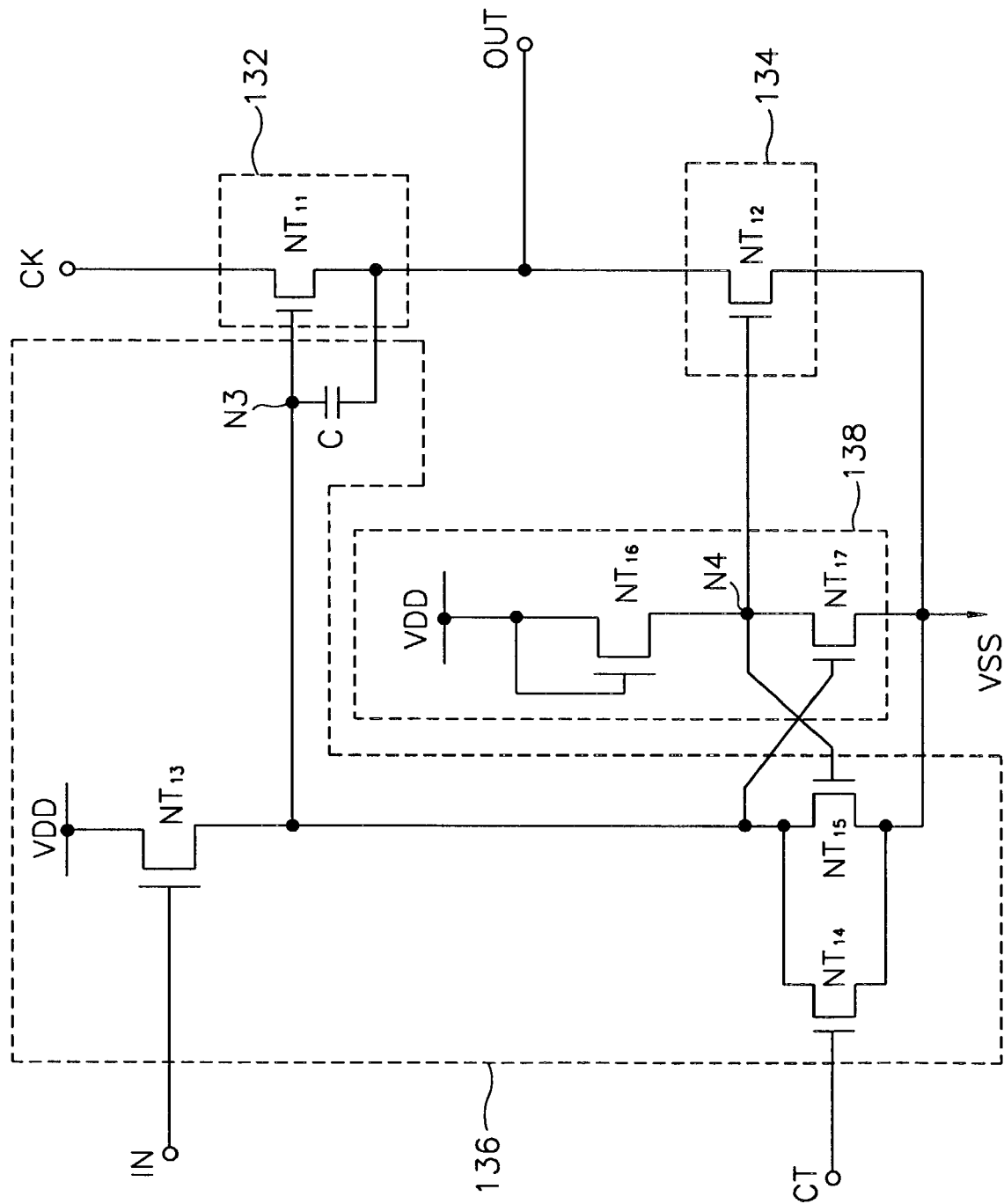
FIG. 7 is a circuit diagram showing respective stages of the gate driving circuit shown in FIG. 4 according to a preferred embodiment of the present invention.

FIG. 7 is a circuit diagram showing respective stages of the gate driving circuit shown in FIG. 4 according to an embodiment of the present invention.

Referring to FIG. 7, the stage includes a pull-up unit 132, a pull-down unit 134, a pull-up driving unit 136, and a pull-down driving unit 138.

The pull-up unit 132 includes a pull-up NMOS transistor $NT_{11}$ having a drain connected to a clock signal input terminal CK, a gate connected to a third node N3, and a source connected to an output terminal OUT.

The pull-down unit 134 includes a pull-down NMOS transistor $NT_{12}$ having a drain connected to the output terminal OUT, a gate connected to a fourth node N4, and a source connected to a first power source voltage terminal VSS.

The pull-up driving unit 136 includes a capacitor C and NMOS transistors $NT_{13}$, $NT_{14}$, and $NT_{15}$. The capacitor C is connected between the third node N3 and the output terminal OUT. The transistor $NT_{13}$ has a drain connected to a second power source voltage terminal VDD, a gate connected to an input terminal IN, and a source connected to the third node N3. The transistor $NT_{14}$ has a drain connected to the third node N3, a gate connected to the control terminal CT, and a source connected to the first power source voltage terminal VSS. The transistor $NT_{15}$ has a drain connected to the third node N3, a gate connected to the fourth node N4, and a source connected to the first power source voltage terminal VSS. At this time, the transistor $NT_{13}$ is formed to be twice the size of the transistor $NT_{15}$.

The pull-down driving unit 138 includes two NMOS transistors $NT_{16}$ and $NT_{17}$. The transistor $NT_{16}$ has a drain and a gate commonly coupled to the second power source voltage terminal VDD, and a source connected to the fourth node N4. The transistor $NT_{17}$ has a drain connected to the fourth node N4, a gate connected to the third node N3, and a source coupled to the first power source voltage terminal VSS. Preferably, the size of the transistor $NT_{16}$ is made larger by about 16 times than that of the transistor $NT_{17}$.

When the first clock signal CK and the scan start signal ST (in FIG. 4) are supplied, the high level interval of the first clock signal CK is delayed in response to the preceding edge of the scan start signal ST by a predetermined time before it is output to output terminal.

The active interval of the scan start signal ST has a phase preceding the high level interval of first clock signal CK by about ¼ period. The active interval of the start signal ST is divided into a preceding edge of the pulse, i.e., setup time Ts1 from the rising edge, and a succeeding edge, i.e., hold time Ts2 to the falling edge. Such a delay characteristic occurs due to the fact that the capacitor C of the pull-up driving unit 134 begins to be charged via the transistor $NT_{13}$ at the preceding edge of the start signal ST, the pull-up transistor $NT_{11}$ is turned on when the voltage of the capacitor C is higher than the threshold voltage between the gate and source of the pull-up transistor $NT_{11}$ and the high level interval of the first clock signal CK appears at the output terminal.

Once the high level interval of the clock signal appears at the output terminal OUT, the output voltage is bootstrapped to the capacitor C to allow the gate voltage of the pull-up transistor $NT_{11}$ to be higher than the turn-on voltage VDD. Accordingly, the pull-up transistor $NT_{11}$ that is the NMOS transistor remains in the full conduction state. Because the size of the transistor $NT_{13}$ is larger by about twice than that of the transistor $NT_{15}$, the transistor $NT_{11}$ is transited to the turn-on state even though the transistor $NT_{15}$ is turned on by the start signal ST.

In the meantime, in connection with the pull-down driving unit 138, the transistor $NT_{17}$ is turned off by the input signal to permit the fourth node N4 to rise up to the second power source voltage VDD, turning on the transistor $NT_{12}$, thereby pulling down the output signal from the output terminal OUT to the state of the first power source voltage VSS. At this time, because the transistor $NT_{17}$ is turned on by the start signal, the potential of the fourth node N4 is pulled-down to the first power source voltage VSS. Even if the transistor $NT_{16}$ is turned on, the fourth node N4 continuously maintains the first power source voltage VSS state since the size of the transistor $NT_{17}$ is larger by approximately 16 times than that of the transistor $NT_{16}$. Therefore, the pull-down transistor $NT_{12}$ is transited from the turn-on state to the turn-off state.

The output signal of the output terminal OUT is provided after being delayed as long as the duty period of the first clock signal CK.

When the voltage of the output signal from the output terminal OUT is pulled down to the turn-off voltage VOFF (=VSS), the transistor $NT_{17}$ is turned off. Since only the second power source voltage VDD is supplied to the fourth node N4 via the transistor $NT_{16}$, the potential of the fourth node N4 begins to rise up to the second power source voltage VDD. When the potential of the fourth node N4 begins to ascend, the transistor $NT_{15}$ is turned on. By doing so, the charging voltage of the capacitor C is discharged via the transistor $NT_{15}$. Accordingly, the pull-up transistor $NT_{11}$ is turned off.

Successively, the output signal of the following stage supplied to the control terminal CT is raised to the turn-on voltage, so that the transistor $NT_{14}$ is turned on. Because the size of the transistor $NT_{14}$ is larger by about twice than that of the transistor $NT_{15}$, the potential of the third node N3 is pulled-down to the first power source voltage VSS at a rate faster than the pulling-down from solely turning-on the transistor $NT_{15}$.

Therefore, the pull-up transistor $NT_{11}$ is turned off and pull-down transistor $NT_{12}$ is turned on to allow the output terminal OUT to drop down from the turn-on voltage VON to the second power source voltage VDD.

Although the output signal of the following stage supplied to the control terminal CT descends to the low level to the turn-off transistor $NT_{14}$, the fourth node N4 remains at the second power source voltage VDD due to the transistor $NT_{16}$ being on. This and third node N3 keep on the transistor $NT_{15}$ and to maintain the state of being biased to the first power source voltage VSS. Due to this construction, the potential of the fourth node N4 is maintained at the second power source voltage VDD, and false triggering of the pull-down transistor $NT_{12}$ is prevented.

The cross-coupled configuration of the transistor $NT_{15}$ and transistor $NT_{17}$ maintains the stable state at the third node N3 and the fourth node N4. Also, not only two transistors are eliminated but also the transistor size is decreased as compared with the configuration of the circuit of FIG. 6. Further, the area occupied by the shift register in the peripheral region can be reduced by as much as about 10%.

Furthermore, the gate driving circuit in FIG. 7 enables the stable operation regardless of the pulse-width of the scan start signal ST as compared with gate driving circuit in FIG. 6. Preferably, the scan start signal ST (in FIG. 4) is latched to make it possible to stably operate regardless of the width of the pulse-width of the scan start signal ST (in FIG. 4).

Figure 8:
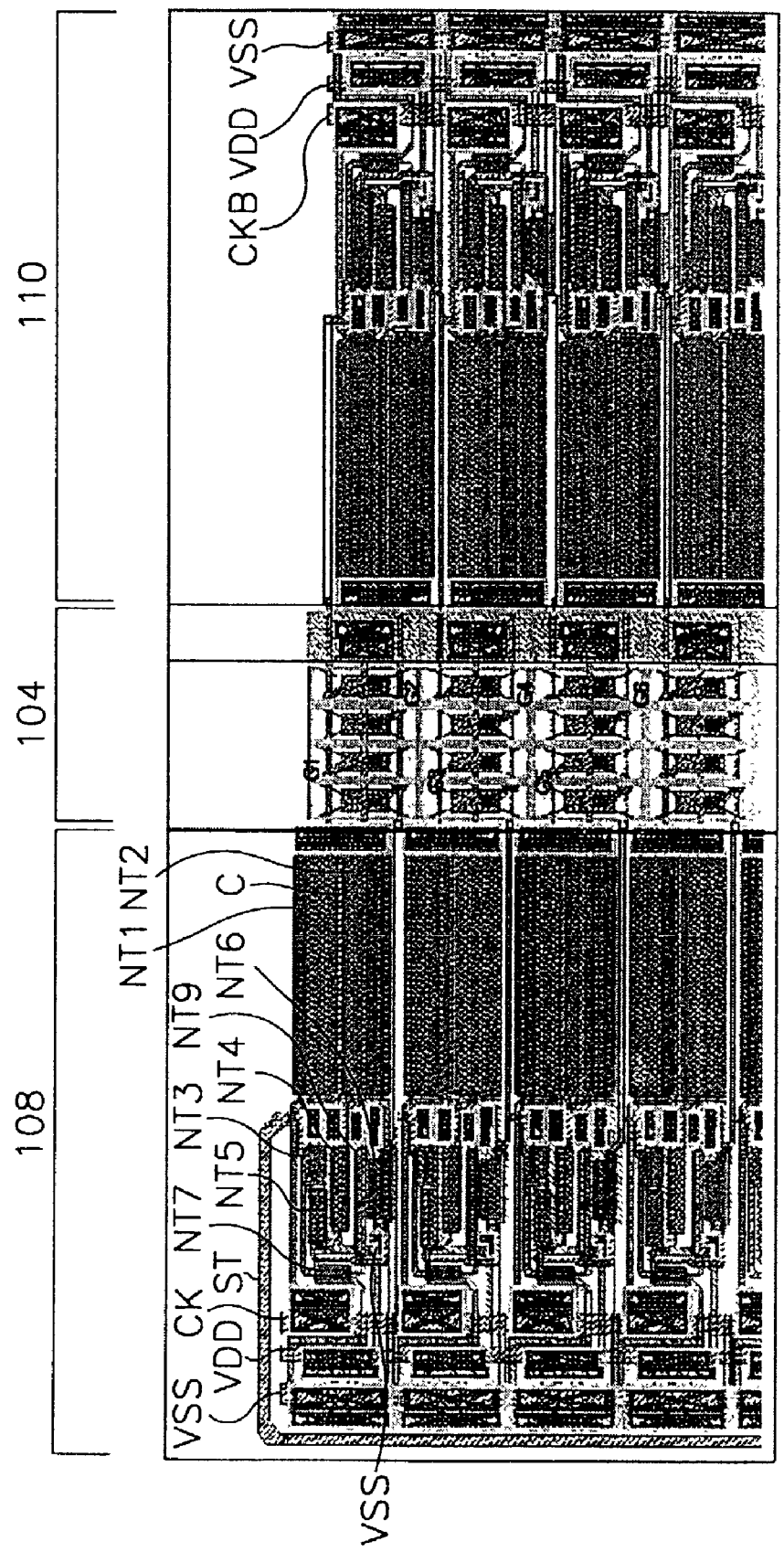
FIG. 8 shows a layout of a display region and a gate driving circuit of a symmetric-type LCD device according to an embodiment of the present invention.

FIG. 8 shows a layout of the display region and the gate driving circuit of the symmetric-type LCD module according to an embodiment of the present invention. FIGS. 9 to 13 show layouts of respective layers of FIG. 8. Like parts in the layout of FIG. 8 are designated by the same reference numerals as of those designated in the gate driving circuit shown in FIG. 6.

Referring to FIG. 8, gate line driving transistors $NT_1$ and $NT_2$ of the first gate driving circuit 108 are arranged at a portion adjacent to the display region 104, and external signal lines CK, VDD, VSS, and ST are arranged at the farthest portion from the display region 104. Control transistors $NT_3$, $NT_4$, $NT_5$, $NT_6$, $NT_7$, $NT_8$, and $NT_9$ are arranged between the areas of the driving transistors and the signal lines. A capacitor C is disposed between the driving transistors $NT_1$ and $NT_2$, and includes a lower electrode connected to a lower extending portion of the gate electrode of the driving transistor $NT_1$, an upper electrode connected to an upper extending portion of the drain electrode of the driving transistor $NT_2$, and a gate insulating layer SiNx disposed between the lower and upper electrodes.

Figure 9:
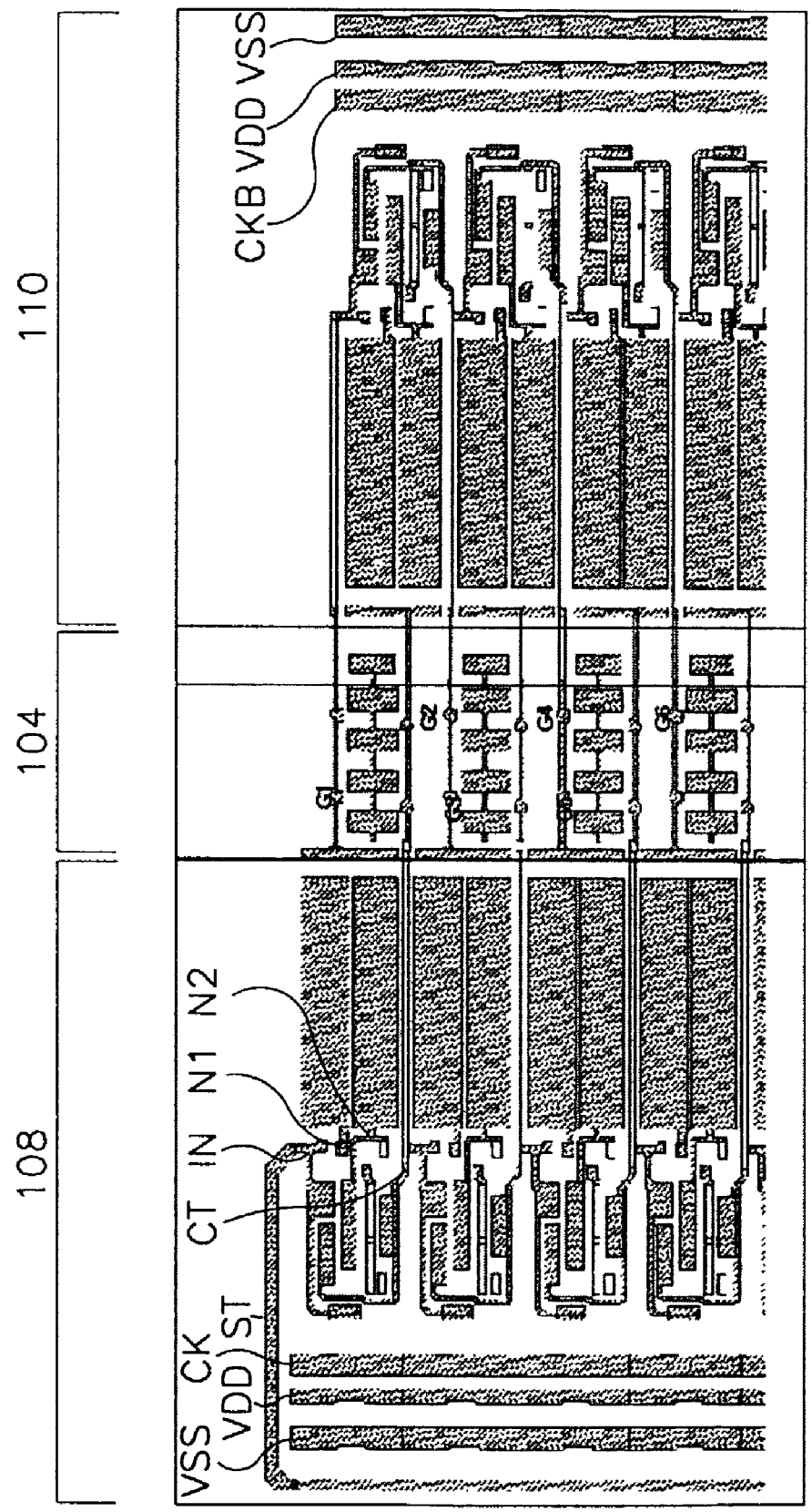
FIGS. 9 to 13 show layouts of respective layers of FIG. 8.

Referring to FIG. 9, a gate metal pattern is formed on a transparent glass substrate. The gate metal pattern forms gate lines GL of the display region 104, gate electrodes of respective transistors of the gate driving circuit region 108 and 110, lower electrode of the capacitor C, signal lines, and partial signal lines for mutually connecting respective stages of the shift register.

Figure 10:
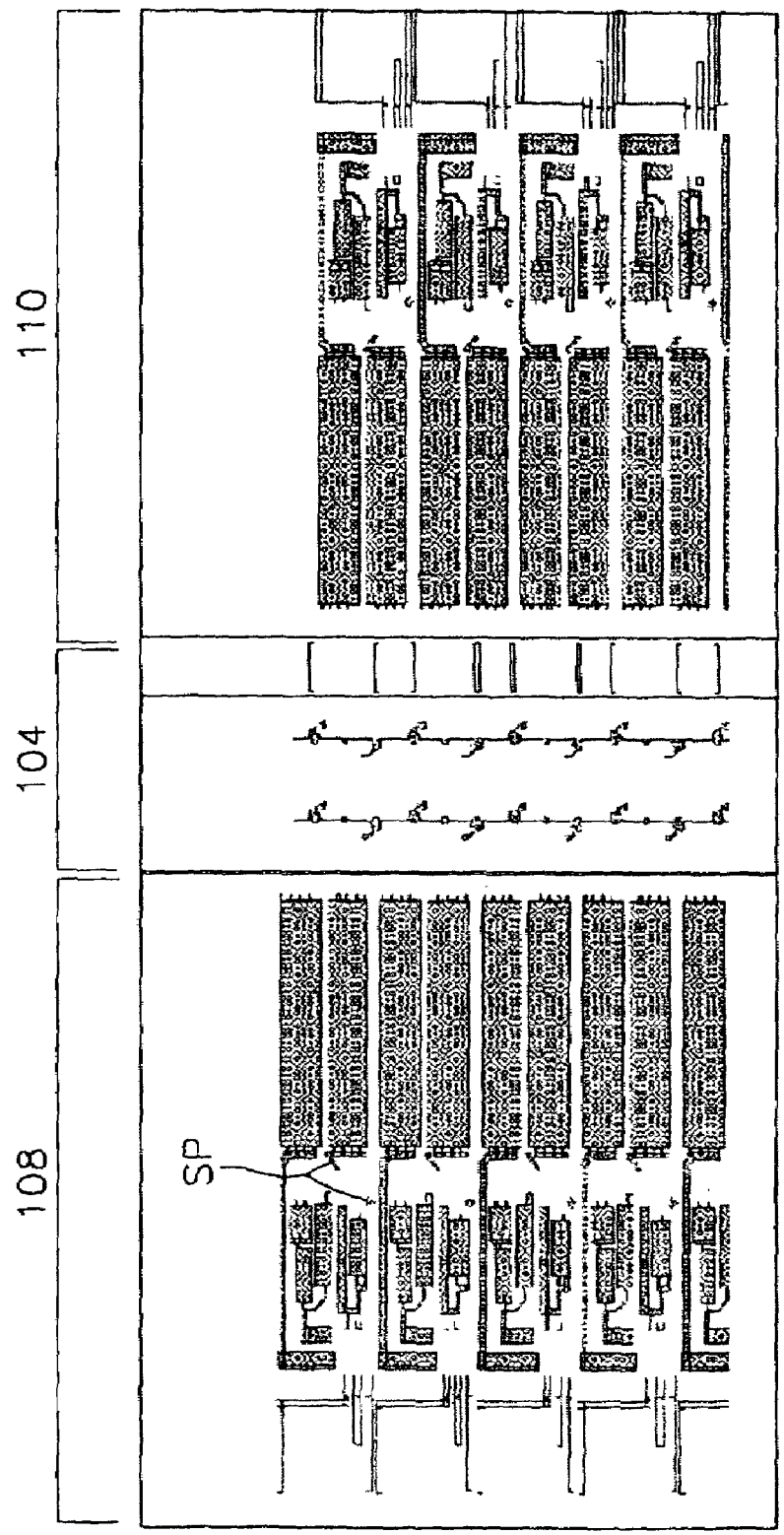

Next, a gate insulating layer such as SiNx or the like is formed on the gate metal pattern. Over the gate insulating layer, an active pattern formed of the amorphous silicon substance shown in FIG. 10 is aligned with the lower pattern. In FIG. 10, the pieces designated by the reference alphabet SP out of the active pattern are dummy patterns added for protecting the source pattern that intersects with the underlying gate pattern. The dummy patterns smoothens the inclination of the surface on which the source pattern being the upper structure is to be formed, thereby preventing the upper source metal line from being shorted.

Figure 11:
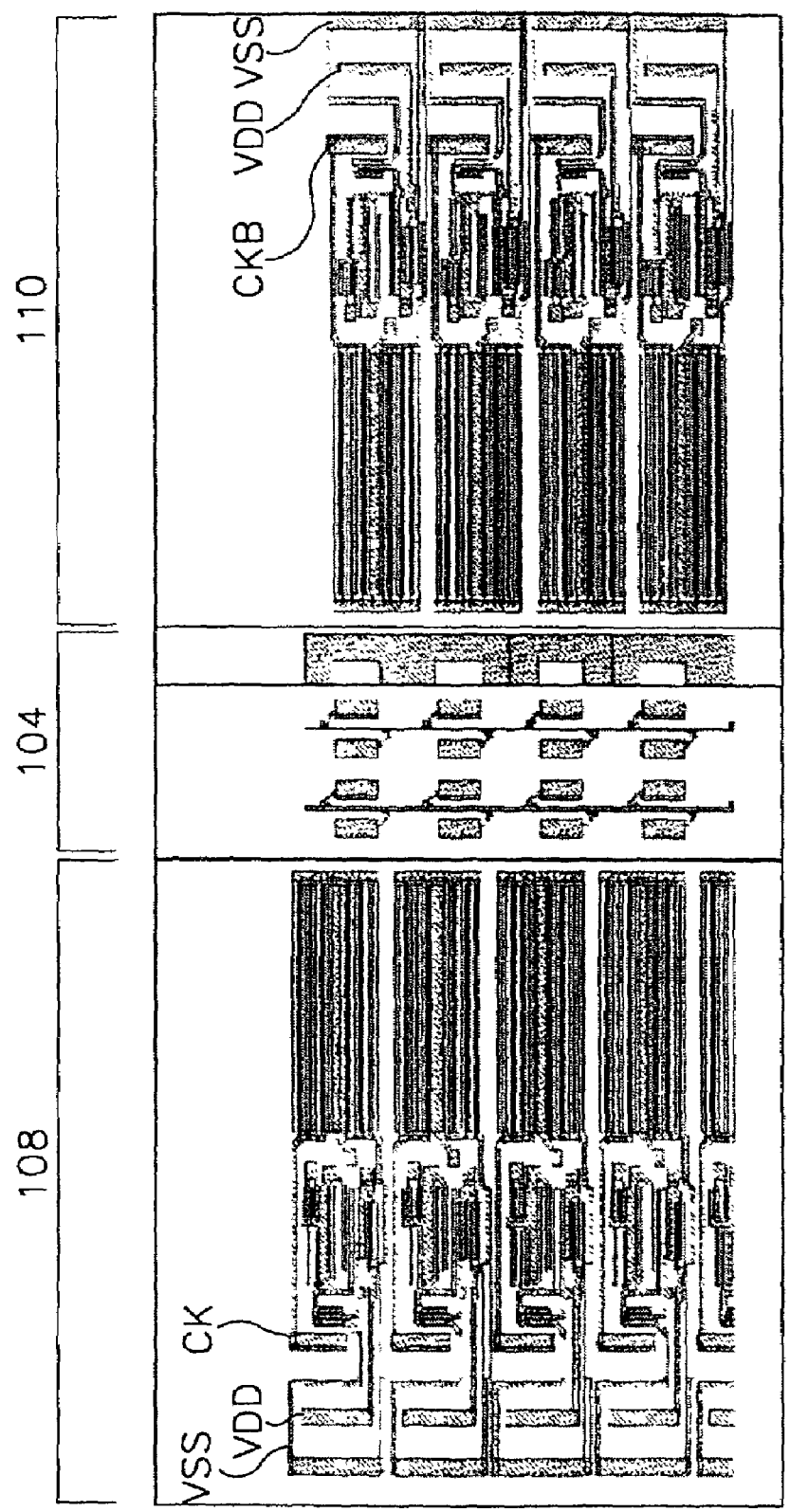

Referring to FIG. 11, a source pattern is arranged after being aligned with the active pattern of FIG. 10. The source pattern forms the contact area of a data line and a pixel electrode in the display region 104, the source and drain electrodes of the transistors, portion of signal lines, and the upper electrode of the capacitor in the gate driving circuit regions 108 and 110. The source and drain electrodes of the driving transistor respectively shaped as the teeth of a comb are formed to be alternately placed onto interlines of the teeth of the comb while facing one another. Such a source-drain electrodes structure of driving transistors $NT_1$ and $NT_2$ increases a channel width of the driving transistor within a limited area to provide sufficient drive capacity of the transistor. The transistor is preferably made from amorphous silicon.

Figure 12:
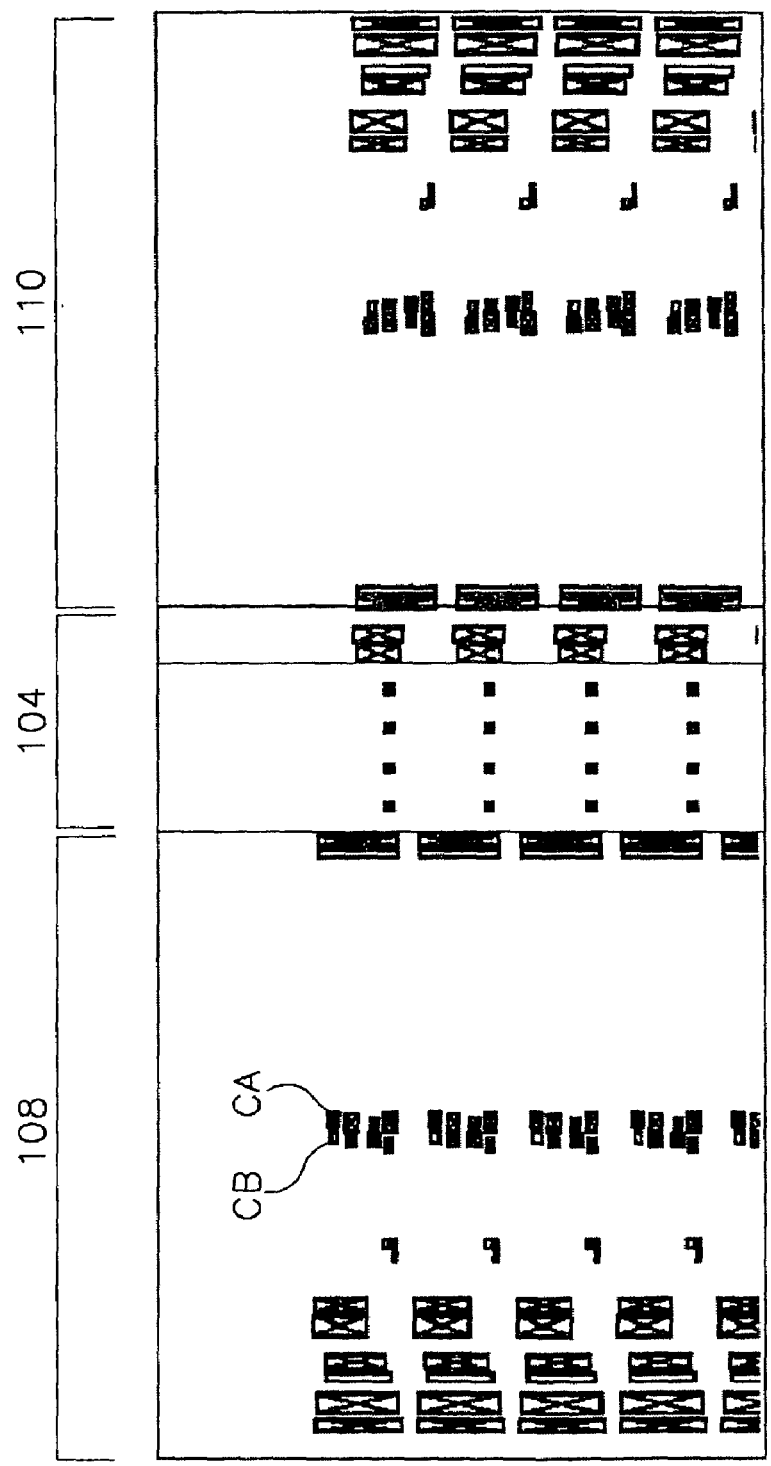

The layout of FIG. 12 shows the contact hole areas of respective patterns for electrically connecting the gate metal pattern and source pattern to each other. In the gate driving circuit region according to the present invention, mutually corresponding gate contact area and source contact area are formed to be adjacent to each other.

Figure 13:
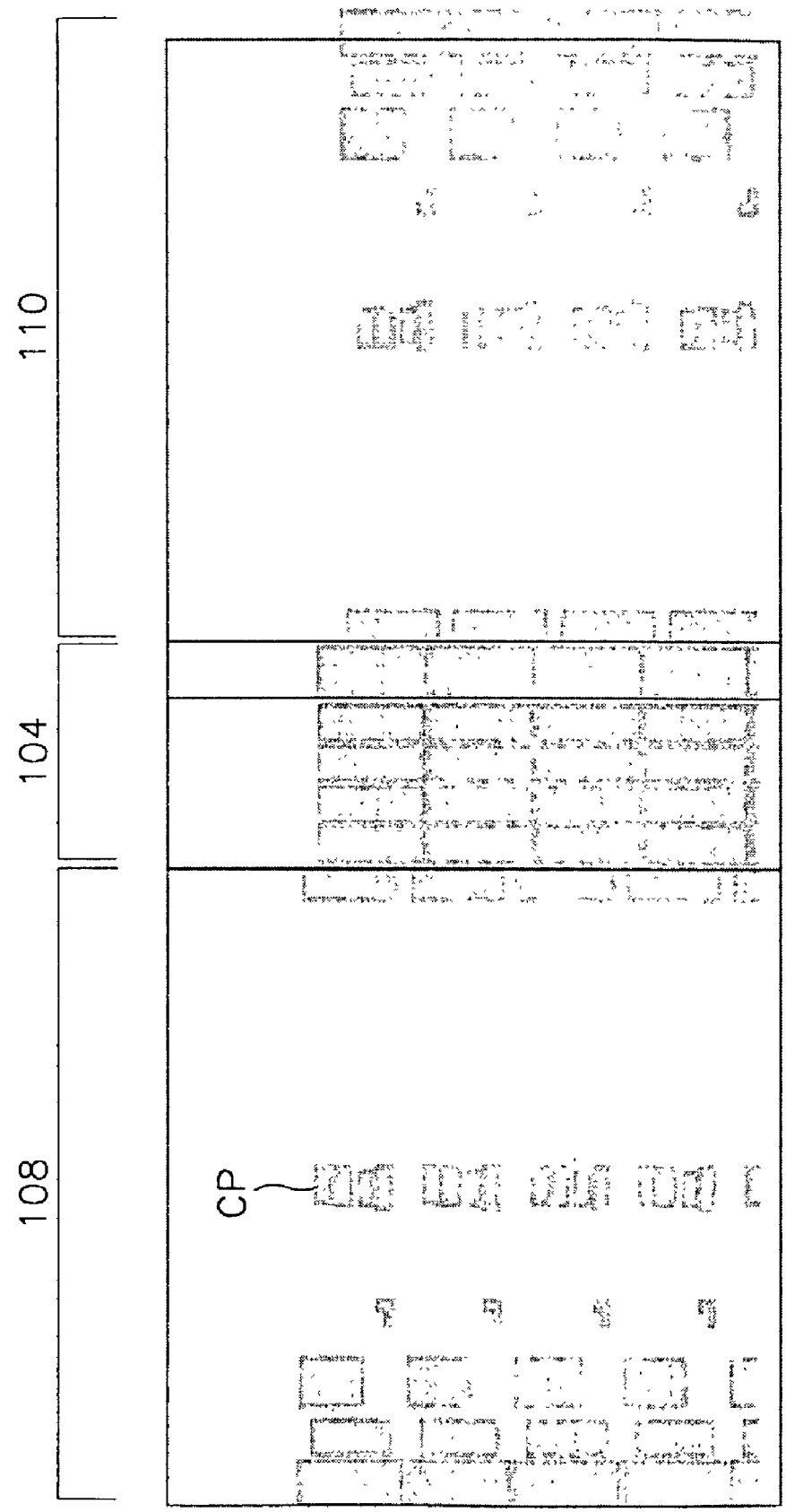

Referring to FIGS. 12 and 13, contact pairs CA and CB formed to be adjacent to each other are electrically connected to each other by means of a contact pattern CP and the pixel electrode pattern in the display region. In other words, according to a preferred embodiment of the present invention, the contact holes are formed for electrically connecting the signal lines formed by the gate metal pattern and source pattern, and the contact pattern is formed of a conductive material identical to that of the pixel electrode to connect them via the contact holes.

Typically, the pixel electrode is formed of a transparent conductive layer such as ITO (indium tin oxide) in a light-transmitting LCD device or a metal reflective layer in a reflective LCD device. Therefore, in case of the light-transmitting type, the transparent conductive layer is used as the contact pattern. Due to this fact, it is preferable to dispose the mutually connected contact holes to be close to each other for the purpose of minimizing the influence from the gate driving circuit caused by the contact resistance regardless of applying the transparent conductive layer that has relatively degraded electricity conductivity as compared with that of the metal pattern.

In addition, it is preferable to secure a sufficient margin in the size of the contact pattern for sufficiently covering the contact hole to thus prevent increased contact resistance or bad contact caused by misalignment.

Figure 14:
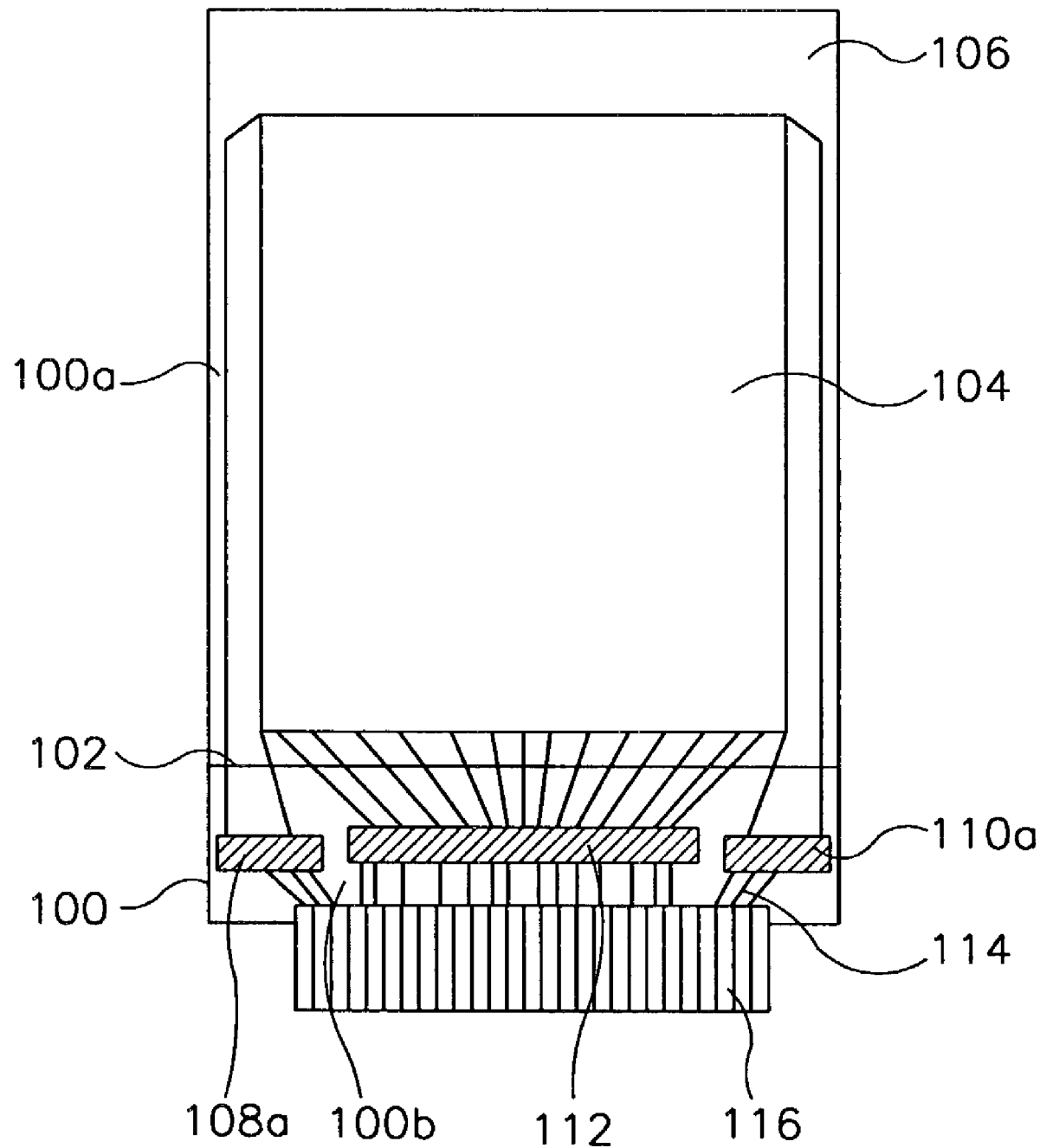
FIG. 14 is a schematic view showing a symmetric-type LCD module having dual gate driving circuits according to another embodiment of the present invention.

FIG. 14 is a schematic view showing a symmetric-type LCD module having dual gate driving circuits according to another embodiment of the present invention.

Referring to the FIG. 14, the LCD module according to another embodiment of the present invention includes a lower substrate 100 and an upper substrate 102. The lower substrate 100 is divided into a first region 100a overlapping with the upper substrate 102 and a second region 100b without overlapping therewith.

The first region 100a includes a display region 104 and a peripheral region 106, which are injected with the liquid crystal prior to being sealed with a sealing material. Line patterns for connecting gate lines of the display region 104 and the first and second gate driving circuits 108a and 110b are respectively placed to be substantially symmetric onto the left and right of peripheral region 106.

The second region 100b is formed with a data driving circuit 112, first and second gate driving circuits 108a and 110a, and an external connection terminal 114 which is attached with one end of a film cable 116. The other end of the film cable 116 is attached to an integrated printed circuit board (not shown). The data driving circuit 112 is fabricated in a chip type to be mounted onto the lower substrate.

Figure 15:
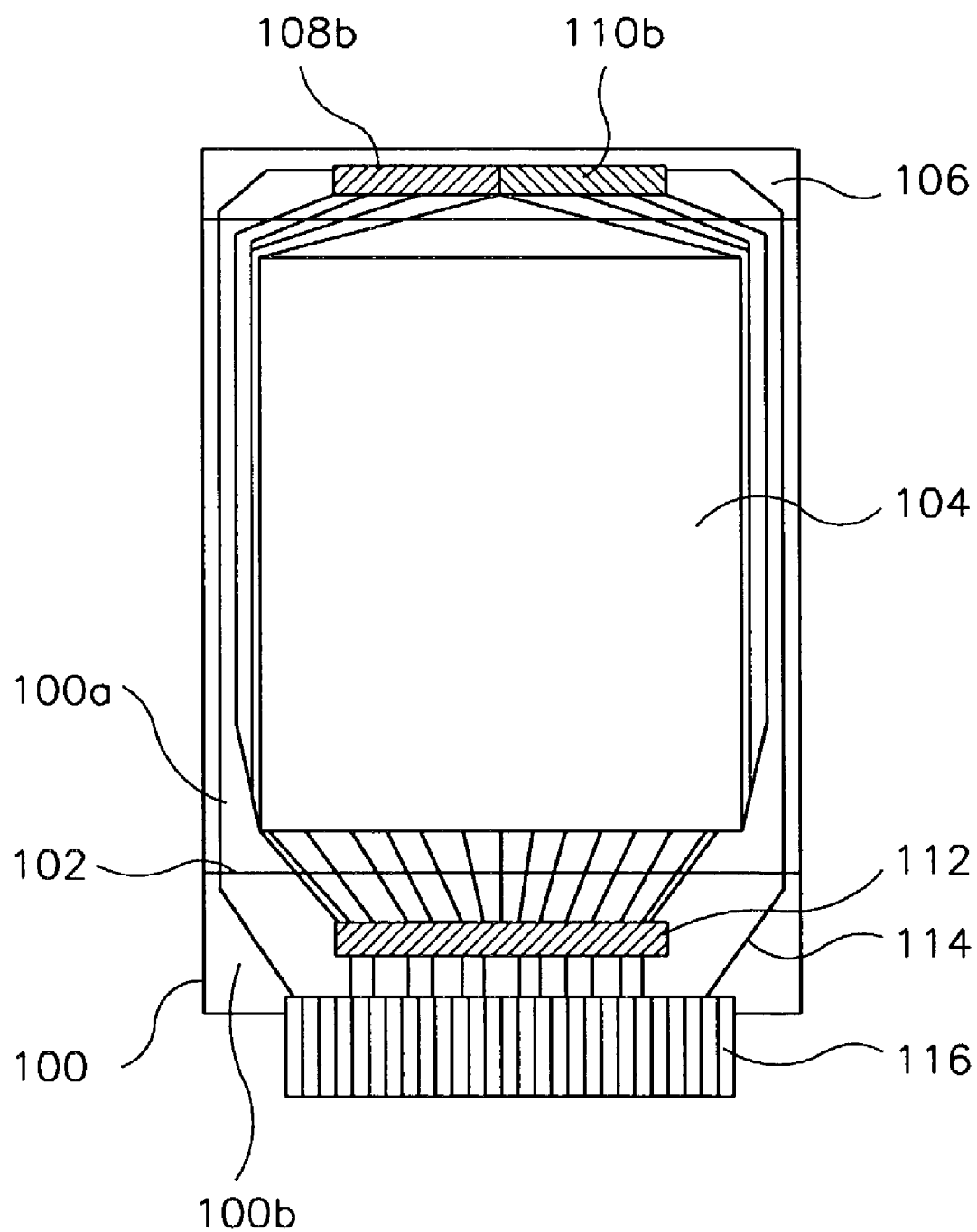
FIG. 15 is a schematic view showing a symmetric-type LCD module having dual gate driving circuits according to another embodiment of the present invention.

FIG. 15 is a schematic view showing a symmetric-type LCD module having dual gate driving circuits according to another embodiment of the present invention.

Referring to FIG. 15, the LCD module includes a lower substrate 100 and an upper substrate 102. The lower substrate 100 is divided into a first region 100a overlapping with an upper substrate 102 and a second region 100b without overlapping therewith.

The first region 100a includes a display region 104 and a peripheral region 106. Then, the display region 104 and the peripheral region 106 are injected with the liquid crystal prior to being sealed with a sealing material along the marginal edges of them. The first and second gate driving circuits 108b and 110b are integrally formed to be disposed at the upper peripheral region 106 over the display region 104. Line patterns for connecting the first and second gate driving circuits 108b and 110b and gate lines of the display region 104 are respectively placed to be substantially symmetric on the left and right of the peripheral region 106.

The second region 100b is formed with a data driving circuit 112 and an external connection terminal 114 attached with one end of a film cable 116. The other end of the film cable 116 is attached to an integrated printed circuit board (not shown). The data driving circuit 112 is fabricated in a form of chip to be mounted onto the lower substrate.

Gate driving circuits 108b and 110b are connected to the film cable 116 via the external connection terminal 114 extending from the lower portion to the upper portion.

In conclusion, the LCD module according to the present invention includes the first and second gate driving circuit respectively, which are arranged to be symmetric onto the left and right of the peripheral region of the display region.

In the present invention as described above, the gate driving circuit are symmetrically arranged onto the left and right of the peripheral region of the display region, thereby minimizing the left and right width of the set mounted with the LCD module.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A liquid crystal display apparatus comprising:
    a plurality of pixel electrodes arranged on a display region of a substrate in a matrix form, the pixel electrodes having a plurality of column lines and a plurality of row lines;
    a plurality of amorphous silicon thin film transistors, each having a first current electrode connected to a corresponding one of the plurality of pixel electrodes;
    a plurality of data lines, each being connected to second current electrodes of the thin film transistors;
    a plurality of first gate lines, each being connected to gate electrodes of odd numbered thin film transistors which are coupled to one of the plurality of row lines;
    a plurality of second gate lines, each being connected to gate electrodes of even numbered thin film transistors which are coupled to the one of the plurality of row lines;
    a data driving circuit for driving the data lines;
    at least two gate driving circuits having a first gate driving circuit and a second gate driving circuit, wherein the first gate driving circuit is connected to the plurality of first gate lines and the second gate driving circuit is connected to the plurality of second gate lines, and wherein the first and second gate driving circuits comprise amorphous silicon thin film transistors and are formed in a peripheral region on the substrate; and
    a plurality of signal lines arranged on the substrate and carrying a first clock signal, a second clock signal, a first power source voltage, a second power source voltage and a start signal, wherein:
    the first and second gate driving circuits drive the row lines of the pixel electrodes in a zigzag form;
    each of the first and second gate driving circuits comprises a plurality of shift registers and sequentially selects the plurality of gate lines in accordance with output signals of respective shift registers; and
    an output signal of a shift register of the first gate driving circuit is supplied as a start signal to a shift register of the second gate driving circuit, wherein each of the first and second gate driving circuits comprises a plurality of stages and sequentially selects the plurality of gate lines in accordance with output signals of respective stages while the first gate driving circuit is supplied with the first clock signal and the second gate driving circuit is supplied with the second clock signal having a phase inverted with that of the first clock signal, and a stage comprises:
    an input terminal connected with a previous gate line;
    an output terminal connected with a corresponding gate line;
    a clock terminal for receiving a corresponding clock signal;
    a pull-up circuit connected between the clock terminal and output terminal;
    a pull-up driving circuit connected to an input node of the pull-up circuit wherein the pull-up driving circuit comprises a capacitor connected to the input node of the pull-up circuit and the output terminal;
    a control terminal connected with a next gate line;
    a pull-down circuit connected between the output terminal and the first power source voltage for allowing the corresponding gate line to pull down to the first power source voltage during a turn-on state;
    a pull-down driving circuit connected to an input node of the pull-down circuit for turning off the pull-down circuit in response to a preceding edge of the input signal and for turning on the pull-down circuit in response to a preceding edge of a control signal; and
    a floating blocking circuit connected between the input node of the pull-down circuit and the second power source voltage for constantly connecting the second power source voltage to the input node of the pull-down circuit to prevent the input node of the pull-down circuit from being floated, wherein the pull-up circuit pulls up the corresponding gate line during a duty period of the clock signal during the turn-on state, and the pull-up driving circuit turns on the pull-up circuit in response to a preceding edge of an input signal supplied to the input terminal and for turning off the pull-up circuit in response to a preceding edge of the control signal supplied to the control terminal.

2. A liquid crystal display apparatus as claimed in claim 1, wherein the stage further comprises a turn-on blocking circuit connected between the input node of the pull-down circuit and the first power source voltage for connecting the first power source voltage to the input node of the pull-down circuit, thereby preventing turn-on of the pull-down circuit.

3. A liquid crystal display apparatus as claimed in claim 2, wherein the turn-on blocking circuit comprises an NMOS transistor having a drain connected to the input node of the pull-down circuit, a gate connected to the output terminal and a source connected to the first power source voltage.

4. A liquid crystal display apparatus as claimed in claim 1, wherein the pull-up driving circuit further comprises:
    a first transistor having a drain and a gate commonly connected to the input terminal and a source connected to the input node of the pull-up circuit;
    a second transistor having a drain connected to the input node of the pull-up circuit, a gate connected to the input node of the pull-down circuit and a source connected to the first power source voltage; and
    a third transistor having a drain connected to the input node of the pull-up circuit, a gate connected to the control terminal, and a source connected to the first power source voltage.

5. A liquid crystal display apparatus as claimed in claim 1, wherein the pull-down driving circuit comprises:

a fourth transistor having a drain coupled to the second power source voltage, a gate connected to the control terminal and a source coupled to the input node of the pull-down circuit; and a fifth transistor having a drain connected to the input node of the pull-down circuit, a gate coupled to the input terminal, and a source connected to the first power source voltage.

6. A liquid crystal display apparatus as claimed in claim 1, wherein the floating blocking circuit comprises a sixth transistor having a drain and a gate connected to the second power source voltage and a source connected to the input node of the pull-down circuit, in such a manner that the sixth transistor is formed to have a size smaller than that of the fifth transistor.

7. A liquid crystal display apparatus as claimed in claim 6, wherein a size ratio between the fifth transistor and sixth transistor is about 20:1.

8. A liquid crystal display apparatus as claimed in claim 1, wherein:

the pull-down circuit selectively pulls down the output terminal to the first power source voltage, and the pull-up circuit supplies the corresponding clock signal from either the first clock signal and the second clock signal to the output terminal, and the pull-up driving circuit charges the capacitor to turn on the pull-up circuit in response to the preceding edge of an input signal and discharges the capacitor to turn off the pull-up circuit.

9. A liquid crystal display apparatus as claimed in claim 8, wherein the pull-up driving circuit further comprises:

a first transistor having a drain connected to the second power source voltage, a gate connected to the input signal and a source connected to the input node of the pull-up circuit;

a second transistor having a drain connected to the input node of the pull-up circuit, a gate connected to the driving signal of next gate line and a source connected to the first power source voltage; and a third transistor having a drain connected to the input node of the pull-up circuit, a gate connected to the input node of the pull-down circuit and a source connected to the first power source voltage.

10. A liquid crystal display apparatus as claimed in claim 9, wherein the first transistor and third transistor have a ratio of approximately 2:1 in size.

11. A liquid crystal display apparatus as claimed in claim 10, wherein the pull-down driving circuit comprises:

a fourth transistor having a drain and a gate commonly connected to the second power source voltage and a source connected to the input node of the pull-down circuit; and a fifth transistor having a drain coupled to the input node of the pull-down circuit, a gate connected to the input node of the pull-up circuit and a source connected to the first power source voltage.

12. A liquid crystal display apparatus as claim in claim 11, wherein the fourth transistor and fifth transistor have a ratio of approximately 16:1 in size.

13. A liquid crystal display apparatus as claimed in claim 1, wherein the first gate driving circuit is disposed in a first peripheral region of the display region for driving the plurality of first gate lines and the second gate driving circuit is disposed in a second peripheral region of the display region opposite to the first peripheral region with respect to the display region for driving the plurality of second gate lines.

14. A liquid crystal display apparatus as claimed in claim 1, wherein the first gate driving circuit is disposed at a first side of the peripheral region and the second gate driving circuit is disposed at a second side of the peripheral region opposite to the first side, for driving the plurality of first gate lines and the plurality of second gate lines, respectively, the first and second gate driving circuits being disposed symmetrically with respect to the data driving circuit.

15. A liquid crystal display apparatus as claimed in claim 1, wherein the data driving circuit is disposed in a first peripheral region and the first and second gate driving circuits are disposed in a second peripheral region.

16. A liquid crystal display apparatus comprising:

a display region comprising a plurality of pixel electrodes, a plurality of amorphous silicon thin film transistors, a plurality of data lines, a plurality of first gate lines, and a plurality of second gate lines, wherein each of the first gate lines is connected to gate electrodes of odd numbered amorphous silicon thin film transistors, each of the second gate lines is connected to gate electrodes of even numbered amorphous silicon thin film transistors, and each thin film transistor has a first terminal connected to a corresponding gate line, a second terminal connected to a corresponding data line, and a third terminal connected to a corresponding pixel electrode;

a data driving circuit for driving the plurality of data lines;

at least two gate driving circuits having a first gate driving circuit and a second gate driving circuit, wherein the first gate driving circuit and the second gate driving circuit are activated in sequence to drive alternating rows of gate lines, and wherein the first and second gate driving circuits comprise amorphous silicon thin film transistors and are formed in a peripheral region on the substrate; and a plurality of signal lines arranged on the substrate and carrying a first clock signal, a second clock signal, a first power source voltage, a second power source voltage and a start signal, wherein:

each of the first and second gate driving circuits comprises a plurality of shift registers and sequentially selects the plurality of gate lines in accordance with output signals of respective shift registers; and an output signal of a shift register of the first gate driving circuit is supplied as a start signal to a shift register of the second gate driving circuit, wherein each of the first and second gate driving circuits comprises a plurality of stages and sequentially selects the plurality of gate lines in accordance with output signals of respective stages, and a stage comprises:

an output terminal connected with a corresponding gate line;

a clock terminal for receiving a corresponding clock signal;

a pull-up circuit connected between the clock terminal and output terminal;

a pull-up driving circuit connected to an input node of the pull-up circuit wherein the pull-up driving circuit comprises a capacitor connected to the input node of the pull-up circuit and the output terminal;

a control terminal connected with a next gate line;

a pull-down circuit connected between the output terminal and the first power source voltage for allowing the corresponding gate line to pull down to the first power source voltage during a turn-on state;

a pull-down driving circuit connected to an input node of the pull-down circuit for turning off the pull-down circuit in response to a preceding edge of the input signal and for turning on the pull-down circuit in response to a preceding edge of a control signal; and a floating blocking circuit connected between the input node of the pull-down circuit and the second power source voltage for constantly connecting the second power source voltage to the input node of the pull-down circuit to prevent the input node of the pull-down circuit from being floated, wherein the pull-up circuit pulls up the corresponding gate line during a duty period of the clock signal during the turn-on state, and the pull-up driving circuit turns on the pull-up circuit in response to a preceding edge of an input signal supplied to the input terminal and for turning off the pull-up circuit in response to a preceding edge of the control signal supplied to the control terminal.

17. A liquid crystal display apparatus as claimed in claim 16, wherein the first gate driving circuit is disposed in a first peripheral region of the display region for driving the plurality of first gate lines and the second gate driving circuit is disposed in a second peripheral region of the display region opposite to the first peripheral region with respect to the display region for driving the plurality of second gate lines.

18. A liquid crystal display apparatus as claimed in claim 16, wherein the first gate driving circuit is disposed at a first side of the peripheral region and the second gate driving circuit is disposed at a second side of the peripheral region opposite to the first side, for driving the plurality of first gate lines and the plurality of second gate lines, respectively, the first and second gate driving circuits being disposed symmetrically with respect to the data driving circuit.

19. A liquid crystal display apparatus as claimed in claim 16, wherein the data driving circuit is disposed in a first peripheral region and the first and second gate driving circuits are disposed in a second peripheral region.

20. A liquid crystal display apparatus comprising:
a display region comprising a plurality of pixel electrodes, a plurality of amorphous silicon thin film transistors, a plurality of data lines, a plurality of first gate lines, and a plurality of second gate lines, wherein each of the first gate lines is connected to gate electrodes of odd numbered amorphous silicon thin film transistors, each of the second gate lines is connected to gate electrodes of even numbered amorphous silicon thin film transistors, and each thin film transistor has a first terminal connected to a corresponding gate line, a second terminal connected to a corresponding data line, and a third terminal connected to a corresponding pixel electrode;
a data driving circuit for driving the plurality of data lines;
at least two gate driving circuits having a first gate driving circuit and a second gate driving circuit formed in a peripheral region of a substrate; and
a plurality of signal lines arranged on the substrate and carrying a first clock signal, a second clock signal, a first power source voltage, a second power source voltage and a start signal, wherein:
the first gate driving circuit and the second gate driving circuit are activated in sequence to drive alternating rows of gate lines,
the first gate driving circuit is disposed at a first side of the peripheral region and the second gate driving circuit is disposed at a second side of the peripheral region opposite to the first side, for driving the plurality of first gate lines and the plurality of second gate lines, respectively, the first and second gate driving circuits being disposed symmetrically with respect to the data driving circuit,
the first and second gate driving circuits comprise amorphous silicon thin film transistors,
each of the first and second gate driving circuits comprises a plurality of shift registers and sequentially selects the plurality of gate lines in accordance with output signals of respective shift registers; and
an output signal of a shift register of the first gate driving circuit is supplied as a control signal to a shift register of the second gate driving circuit, wherein each of the first and second gate driving circuits comprises a plurality of stages and sequentially selects the plurality of gate lines in accordance with output signals of respective stages, and a stage comprises:
an output terminal connected with a corresponding gate line;
a clock terminal for receiving a corresponding clock signal;
a pull-up circuit connected between the clock terminal and output terminal;
a pull-up driving circuit connected to an input node of the pull-up circuit wherein the pull-up driving circuit comprises a capacitor connected to the input node of the pull-up circuit and the output terminals;
a control terminal connected with a next gate line;
a pull-down circuit connected between the output terminal and the first power source voltage for allowing the corresponding gate line to pull down to the first power source voltage during a turn-on state;
a pull-down driving circuit connected to an input node of the pull-down circuit for turning off the pull-down circuit in response to a preceding edge of the input signal and for turning on the pull-down circuit in response to a preceding edge of a control signal; and
a floating blocking circuit connected between the input node of the pull-down circuit and the second power source voltage for constantly connecting the second power source voltage to the input node of the pull-down circuit to prevent the input node of the pull-down circuit from being floated, wherein the pull-up circuit pulls up the corresponding gate line during a duty period of the clock signal during the turn-on state, and the pull-up driving circuit turns on the pull-up circuit in response to a preceding edge of an input signal supplied to the input terminal and for turning off the pull-up circuit in response to a preceding edge of the control signal supplied to the control terminal.

21. A liquid crystal display apparatus comprising:
a plurality of pixel electrodes arranged on a display region of a substrate in a matrix form, the pixel electrodes having a plurality of column lines and a plurality of row lines;
a plurality of thin film transistors, each having a first current electrode connected to a corresponding one of the plurality of pixel electrodes;
a plurality of data lines, each being connected to second current electrodes of the thin film transistors;
a plurality of first gate lines, each being connected to gate electrodes of odd numbered thin film transistors which are coupled to one of the plurality of row lines;
a plurality of second gate lines, each being connected to gate electrodes of even numbered thin film transistors which are coupled to the one of the plurality of row lines;
a data driving circuit for driving the data lines;
at least two gate driving circuits having a first gate driving circuit and a second gate driving circuit integrated on a peripheral region of the substrate, wherein the first gate driving circuit is connected to the plurality of first gate lines and the second gate driving circuit is connected to the plurality of second gate lines; and
a plurality of signal lines arranged on the peripheral region of the substrate and carrying a first clock signal, a second clock signal, a first power source voltage, a second power source voltage and a start signal, wherein:

each of the first and second gate driving circuits comprises a plurality of shift registers and sequentially selects the plurality of gate lines in accordance with output signals of respective shift registers; and an output signal of a shift register of the first gate driving circuit is supplied as a control signal to a shift register of the second gate driving circuit, wherein each of the first and second gate driving circuits comprises a plurality of stages and sequentially selects the plurality of gate lines in accordance with output signals of respective stages, and a stage comprises:

an output terminal connected with a corresponding gate line;

a clock terminal for receiving a corresponding clock signal;

a pull-up circuit connected between the clock terminal and output terminal;

a pull-up driving circuit connected to an input node of the pull-up circuit wherein the pull-up driving circuit comprises a capacitor connected to the input node of the pull-up circuit and the output terminal;

a control terminal connected with a next gate line;

a pull-down circuit connected between the output terminal and the first power source voltage for allowing the corresponding gate line to pull down to the first power source voltage during a turn-on state;

a pull-down driving circuit connected to an input node of the pull-down circuit for turning off the pull-down circuit in response to a preceding edge of the input signal and for turning on the pull-down circuit in response to a preceding edge of a control signal; and a floating blocking circuit connected between the input node of the pull-down circuit and the second power source voltage for constantly connecting the second power source voltage to the input node of the pull-down circuit to prevent the input node of the pull-down circuit from being floated, wherein the pull-up circuit pulls up the corresponding gate line during a duty period of the clock signal during the turn-on state, and the pull-up driving circuit turns on the pull-up circuit in response to a preceding edge of an input signal supplied to the input terminal and for turning off the pull-up circuit in response to a preceding edge of the control signal supplied to the control terminal.

* * * * *